US012672488B2

(12) United States Patent
Robson et al.

(10) Patent No.: US 12,672,488 B2
(45) Date of Patent: Jun. 30, 2026

(54) A-AXIS JOSEPHSON JUNCTIONS WITH IMPROVED SMOOTHNESS

(71) Applicant: Ambature, Inc., Scottsdale, AZ (US)

(72) Inventors: Mitchell Robson, Toronto (CA); Michael S. Lebby, San Francisco, CA (US); Davis H. Hartman, Scottsdale, AZ (US)

(73) Assignee: Ambature, Inc., Scottsdale, AZ (US)

( * ) Notice: Subject to any disclaimer, the term of this patent is extended or adjusted under 35 U.S.C. 154(b) by 404 days.

(21) Appl. No.: 17/859,419

(22) Filed: Jul. 7, 2022

(65) Prior Publication Data

US 2023/0172075 A1 Jun. 1, 2023

Related U.S. Application Data

(60) Provisional application No. 63/219,417, filed on Jul. 8, 2021.

(51) Int. Cl.
| | |
|---|---|
| *H10N 60/01* | (2023.01) |
| *H10N 60/12* | (2023.01) |
| *H10N 60/85* | (2023.01) |

(52) U.S. Cl.
CPC ..... *H10N 60/0912* (2023.02); *H10N 60/0688* (2023.02); *H10N 60/12* (2023.02); *H10N 60/858* (2023.02)

(58) Field of Classification Search
CPC . H10N 60/0941; H10N 60/124; H10N 60/805
See application file for complete search history.

(56) References Cited

U.S. PATENT DOCUMENTS

| | | | | |
|---|---|---|---|---|
| 5,289,721 | A | * | 3/1994 | Tanizawa ............. G01L 9/0054 |
| | | | | 338/4 |
| 2003/0006214 | A1 | * | 1/2003 | Stearns .................... G03F 1/24 |
| | | | | 430/5 |

(Continued)

FOREIGN PATENT DOCUMENTS

| | | | | |
|---|---|---|---|---|
| JP | 2000299509 | A | * | 10/2000 |
| JP | 2004071923 | | * | 3/2004 |

OTHER PUBLICATIONS

International Search Report and Written Opinion dated Oct. 12, 2022 issued in related International Application No. PCT/US2022/036322.

*Primary Examiner* — Matthew L Reames
(74) *Attorney, Agent, or Firm* — Toering Patents PLLC

(57) ABSTRACT

According to various implementations of the invention, high quality a-axis XBCO may be grown with low surface roughness. According to various implementations of the invention, low surface roughness may be obtained by: 1) adequate substrate preparation; 2) calibration of flux rates for constituent atoms; and/or 3) appropriate control of temperature during crystal growth. According to various implementions of the invention, a wafer comprises a smoothing layer of c-axis XBCO; a first conducting layer of a-axis XBCO formed on the smoothing layer; an insulating layer formed on the first conducting layer; and a second conducting layer of a-axis XBCO formed on the insulating layer, where, for a same surface roughness, a thickness of the smoothing layer and the first conducting layer combined is greater than a thickness of the first conducting layer without the smoothing layer. According to various implementations of the invention, a Josephson Junction is etched out of the XBCO/insulating layer/XBCO trilayer by: ion mill etching the top XBCO layer and some of the insulating layer to intentionally leave some of the insulating layer on the (Continued)

bottom XBCO layer; and/or ion mill etching at least the insulating layer at an off angle to reduce or minimize ion damage to the bottom XBCO layer otherwise introduced by the ion mill.

20 Claims, 21 Drawing Sheets

(56)                    References Cited

U.S. PATENT DOCUMENTS

| 2004/0232405 | A1 |   | 11/2004 | Horbie et al. |
|---|---|---|---|---|
| 2005/0043185 | A1 |   | 2/2005 | Suzuki et al. |
| 2013/0285069 | A1 | * | 10/2013 | Yano .................... H10D 30/668 |
|  |  |  |  | 257/77 |
| 2014/0113828 | A1 |   | 4/2014 | Gilbert et al. |
| 2015/0118604 | A1 |   | 4/2015 | Dynes et al. |
| 2020/0091398 | A1 |   | 3/2020 | Lebby et al. |
| 2021/0404051 | A1 | * | 12/2021 | Srinivasan .............. C23C 14/14 |

* cited by examiner

500

600

CuO (111) on MgO (100)

BaO (001) on SrTiO₃ (100)

$Y_2O_3$ (111) on $ZrO_2$:Y (111)

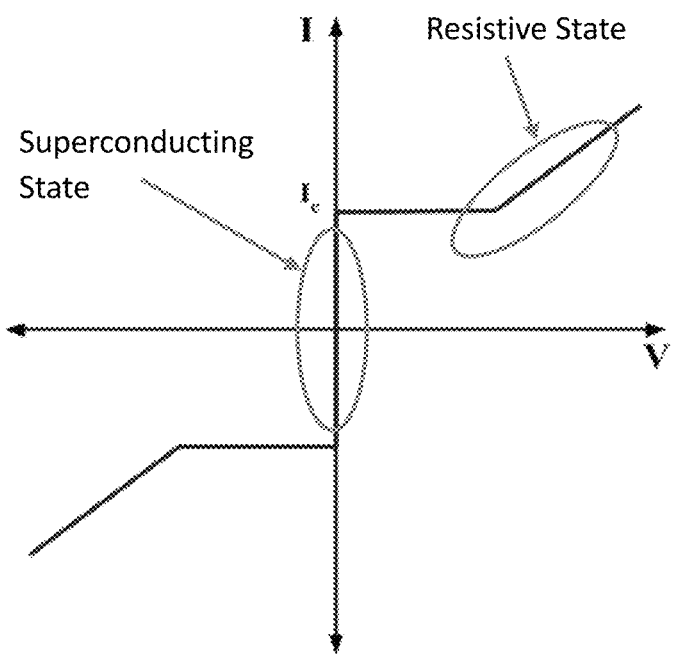
FIGURE 26
Initial Testing
Configuration
Final Testing
Configuration
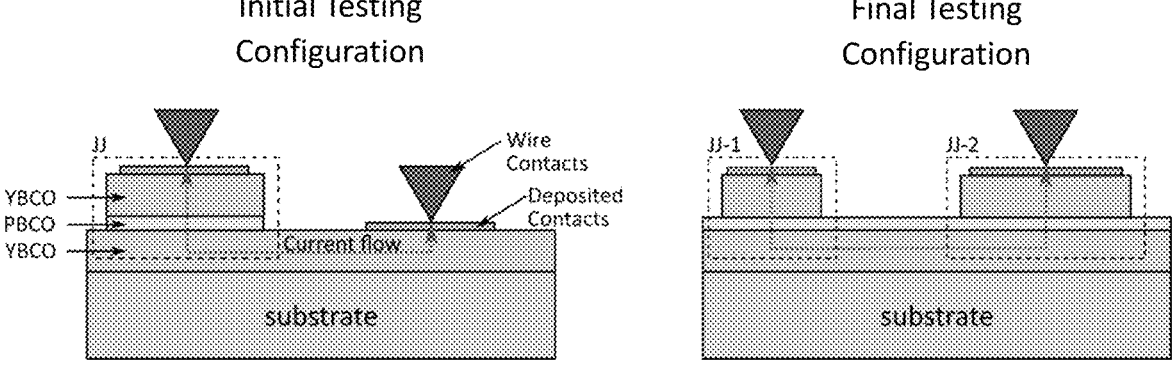
FIGURE 27A                    FIGURE 27B

A-AXIS JOSEPHSON JUNCTIONS WITH IMPROVED SMOOTHNESS

CROSS-REFERENCE TO RELATED APPLICATIONS

This application claims priority to U.S. Provisional Patent Application No. 63/219,417, entitled "A-axis Josephson Junctions with Improved Smoothness," filed on Jul. 8, 2021, which is incorporated herein by reference in its entirety.

FIELD OF THE INVENTION

The invention is generally related to Josephson Junctions, and more specifically, to techniques for manufacturing Josephson Junctions from a-axis YBCO with improved smoothness.

BACKGROUND OF THE INVENTION

Recently, employing YBCO materials in an a-axis crystalline orientation have become desirable, including for fabricating Josephson Junctions. In order to simplify fabrication of a-axis Josephson Junctions (as well as other circuits employing a-axis materials), thick layers (e.g., greater than 100 nm) of a-axis materials and low surface roughness (e.g., less than 1 nm) are desired. However, researchers have found a positive correlation between thickness of certain a-axis materials and their surface roughness (also sometimes described as surface smoothness). For example, a-axis materials having a thickness of 100 nm had a surface roughness of 2 nm, with the surface roughness increasing as the thickness increased.

Increased thickness of a-axis materials with improved (i.e., lower) surface roughness are needed.

SUMMARY OF THE INVENTION

According to various implementions of the invention, a wafer comprises a smoothing layer of c-axis XBCO; a first conducting layer of a-axis XBCO formed on the smoothing layer; an insulating layer formed on the first conducting layer; and a second conducting layer of a-axis XBCO formed on the insulating layer, where, for a same surface roughness, a thickness of the smoothing layer and the first conducting layer combined is greater than a thickness of the first conducting layer without the smoothing layer.

According to various implementations of the invention, a-axis thin film YBCO layers may be deposited using a technique called molecular beam epitaxy (MBE). MBE is a well-characterized crystal growth technique for improved thin films in the semiconductor domain. According to various implementations of the invention, MBE may be used to grow very high quality YBCO (and similar materials) thin films in an a-axis crystal orientation. Various implementations of the invention provide higher crystalline quality, higher accuracy in film thickness, higher a-axis orientation, as well as single crystal growth with lattice matching or strained lattice matching with YBCO-related thin film materials.

Various implementations of the invention utilize various perovskite materials including, but not limited to, $YBa_2Cu_3O_{7-x}$, $PrBa_2Cu_3O_{7-x}$, $DyBa_2Cu_3O_{7-x}$, $NdBa_2Cu_3O_{7-x}$, and other perovskites, which are commonly referred to as simply YBCO, PBCO, DBCO, NBCO, etc., respectively, as would be appreciated. Such materials may commonly and collectively be expressed as $XBa_2Cu_3O_{7-x}$ (XBCO) where X can be elements such as Y, Pr, Dy, Nd, etc., as would be appreciated.

According to various implementations of the invention, high quality a-axis XBCO may be grown with low surface roughness. "Surface roughness" may be generally described as deviations in the direction of a normal vector of an actual surface(s) of the material from an ideal surface.

According to various implementations of the invention, achieving low surface roughness in a-axis XBCO may be obtained by: 1) adequate substrate preparation; 2) calibration of MBE flux; and 3) appropriate control of temperature during crystal growth.

These and other features of the invention are described in detail below.

BRIEF DESCRIPTION OF THE DRAWINGS

FIG. 26 illustrates an ideal I-V curve for an operating Josephson Junction as would be appreciated.

FIGS. 27A-27B illustrate initial and final testing configurations for operation of the Josephson Junctions in accordance with various implementations of the invention.

DETAILED DESCRIPTION

Figure 1:
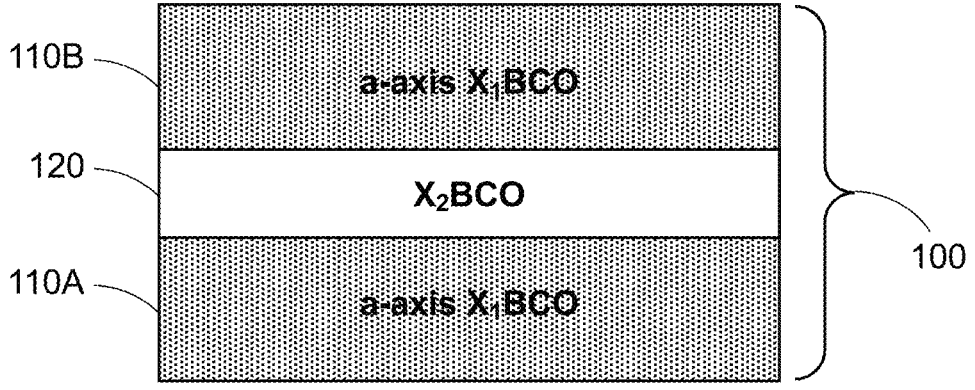
FIG. 1 illustrates Josephson Junction component layers having two conducting layers and an insulating layer between the conducting layers according to various implementations of the invention.

Various implementations of the invention utilize various perovskite materials including, but not limited to, $YBa_2Cu_3O_{7-x}$, $PrBa_2Cu_3O_{7-x}$, $DyBa_2Cu_3O_{7-x}$, $NdBa_2Cu_3O_{7-x}$, and other perovskites, which are commonly referred to as simply YBCO, PBCO, DBCO, NBCO, etc., respectively, as would be appreciated. Such materials may commonly and collectively be expressed as $XBa_2Cu_3O_{7-x}$ (XBCO) where X can be elements such as Y, Pr, Dy, Nd, etc., as would be appreciated.

According to various implementations of the invention, molecular beam epitaxy (MBE) may be used to grow very high quality XBCO thin films in an a-axis crystal orientation, though other processes for growing a-axis XBCO may be used as would be appreciated. Various implementations of the invention provide higher crystalline quality, higher accuracy in film thickness, higher a-axis orientation, as well as single crystal growth with lattice matching or strained lattice matching with XBCO-related thin film materials.

According to various implementations of the invention, high quality a-axis XBCO may be grown with low surface roughness. "Surface roughness" may be generally described as deviations in the direction of a normal vector of an actual surface(s) of the material from an ideal surface. One mechanism for achieving low surface roughness for a-axis XBCO is described in U.S. Provisional Patent Application No. 63/035,162, having a filing date of Jun. 5, 2020, and entitled "Forming A-axis YBCO by Molecular Beam Epitaxy," which is one of the priority applications incorporated above, and now described.

Various implementations of the invention are directed toward growing high quality a-axis XBCO on substrates. While various implementations of the invention are described as useful for growing high quality a-axis XBCO, such implementations may be used for growing high quality a-axis YBCO, or other perovskites, as would be appreciated.

For purposes of this description, "surface roughness" may be used to assess a quality of the a-axis XBCO, with lower measures of surface roughness being generally preferable to higher measures of roughness. Other measures may be used to assess a quality of a-axis XBCO as would be appreciated. In some implementations of the invention, surface roughness is less than 10 nm. In some implementations of the invention, surface roughness is less than 2 nm. In some implementations of the invention, surface roughness is less than 1.5 nm In some implementations of the invention, surface roughness is less than 0.5 nm.

According to various implementations of the invention, high quality a-axis XBCO may be obtained by: 1) adequately preparing a substrate; 2) calibrating MBE flux; and 3) controlling temperature during crystal growth. Each of these is described below.

According to various implementations of the invention, adequately preparing a substrate for subsequent XBCO crystal growth may be important for producing high quality a-axis XBCO. A "smooth" substrate (i.e., a substrate with low roughness) ensures a smoother XBCO surface. According to various implementations of the invention, reflection high-energy electron diffraction (RHEED) may be used to characterize the surface of the substrate. According to various implementations of the invention, a smooth substrate surface will produce clear RHEED patterns and ultimately, a smooth XBCO surface.

In some implementations of the invention, lanthanum aluminate ($LaAlO_3$ or commonly referred to as LAO) may be used a substrate. LAO is an inorganic, ceramic oxide with a distorted perovskite structure. Other similar materials may be used as the substrate as would be appreciated.

In some implementations of the invention, the substrate may have a uniformly terminated, atomically smooth surface. In some implementations of the invention, LAO may be terminated with aluminum oxide ($AlO_2$) for stability. In some implementations, LAO may be terminated with $AlO_2$ as described in J. R. Kim et al., "Experimental realization of atomically flat and $AlO_2$-terminated $LaAlO_3$ (001) substrate surfaces," *Phys. Rev. Mater.*, vol. 3, no. 2, pp. 1-8, 2019 ("Kim"), which was included as Appendix A in U.S. Provisional Application No. 63/035,162, which is one of the priority applications incorporated above. Kim outlines a process for removing lanthanum and creating a smooth aluminum oxide surface.

In some implementations, the substrate may be etched in boiling water, annealed at 1300° C. in air for 10 hours, and then etched again in boiling water, to obtain an $AlO_2$-terminated surface with a step-and-terrace morphology.

In some implementations of the invention, terminating the LAO to produce the $AlO_2$ surface may be accomplished by annealing the LAO substrate at 1200° C. under oxygen for nominally three hours and then sonicating the annealed LAO substrate in deionized water for nominally two hours.

In some implementations of the invention, LAO may be terminated with lanthanum oxide ($La_2O_3$) for stability as would be appreciated. In some implementations of the invention, LAO may be terminated with some mixture of aluminum oxide and lanthanum oxide as would be appreciated.

According to various implementations of the invention, calibrating atomic flux rates in the MBE may be may be important for producing high quality a-axis XBCO. For example when XBCO is YBCO, precise control of flux rates for each of yttrium, barium and copper atomic may be important for producing high quality a-axis YBCO. In such crystals, there are one yttrium and two barium atoms for every three copper atoms, so the incoming rate of atoms should be precisely set and controlled to these ratios (i.e., a rate of flux of yttrium is one third of a rate of flux of copper, and a rate of flux of barium is two thirds of the rate of flux of copper). Other ratios may be used when rare earth metals other than yttrium are used as would be appreciated.

In some implementations of the invention, stoiciometric flux calibration may be used as would be appreciated. In some implementations of the invention, RHEED or atomic absorption spectroscopy may be used to measure an incoming rate of the respective atoms.

In some implementations of the invention, a four-step calibration process may be used to calibrate atomic flux rates in the MBE. In a first step, fluxes of each of the constituent atoms are tuned near their target stoichiometric ratios using standard flux monitoring tools, such as a quartz crystal microbalance (QCM), a beam flux monitor (BFM), or other flux monitoring tools as would be appreciated. This first step may be referred to as a "coarse calibration."

In a second step, or "fine calibration," because each constituent atom of YBCO (yttrium, barium, copper) has an easy-to-form binary oxide (e.g., $Y_2O_3$, BaO and/or $BaO_2$, CuO and/or $Cu_2O$, etc.), such binary oxides may be grown sequentially on lattice-matched substrates or buffer layers (e.g., $Y_2O_3$ on YSZ, BaO or $BaO_2$ on STO, CuO or $Cu_2O$ on MgO) in conditions similar to those used to ultimately grow YBCO. During this fine calibration, in-situ RHEED and ex-situ X-ray reflectivity may provide very precise measurements of growth rate of these binary oxides which can be used to determine precise flux values using the standard lattice constants of the films and substrates as would be appreciated. Similar fine calibration using other binary oxides may be used when rare earth metals other than yttrium are used as would be appreciated.

In a third step, coarse calibration and fine calibration are repeated until the target flux ratios are obtained. In some implementations of the invention, the flux rate for one of constituent atoms may be set, and then the flux rate(s) of the remaining constituent atom(s) may be iteratively tuned to their corresponding flux ratio. In some implementations of the invention, a flux rate of copper may be set, and then flux rates of yttrium and barium may be iteratively tuned to one third and two thirds of copper, respectively.

In a fourth step, a calibration test sample of XBCO may be completed on a small scale, such as a 1 cm×1 cm substrate. In some implementations, the calibration test sample may be analyzed via ex-situ x-ray diffraction (XRD), which may provide information regarding the composition and quality of the calibration test sample as measured, for example, by standard tools such as atomic force microscope (AFM), transmission electron microscopy (TEM), scanning electron microscope (SEM), etc. In some implementations, the calibration test sample may be analyzed via in-situ x-ray photoelectron spectroscopy (XPS), which may provide information regarding the composition and quality of the calibration test sample. Other techniques that will provide compositional information may be Rutherford backscatter spectrometry (RBS), electron energy loss spectroscopy (EELS), electron dispersive x-ray spectroscopy (EDX), etc. Based on the composition of the calibration test sample, any of the foregoing steps may be repeated to further fine tune the flux rates.

According to various implementations of the invention, controlling temperature during crystal growth during MBE may be may be important for producing high quality a-axis XBCO. In some implementations of the invention, a positive temperate ramp may be desirable during crystal growth. In some implementations of the invention, starting crystal growth at a low temperature may force XBCO crystals to form in the a-axis orientation. In some implementations of the invention, slowly increasing temperature maintains the a-axis orientation of the XBCO crystals while improving crystal quality and material properties, including, but not limited to, superconducting properties.

6

Figure 8:
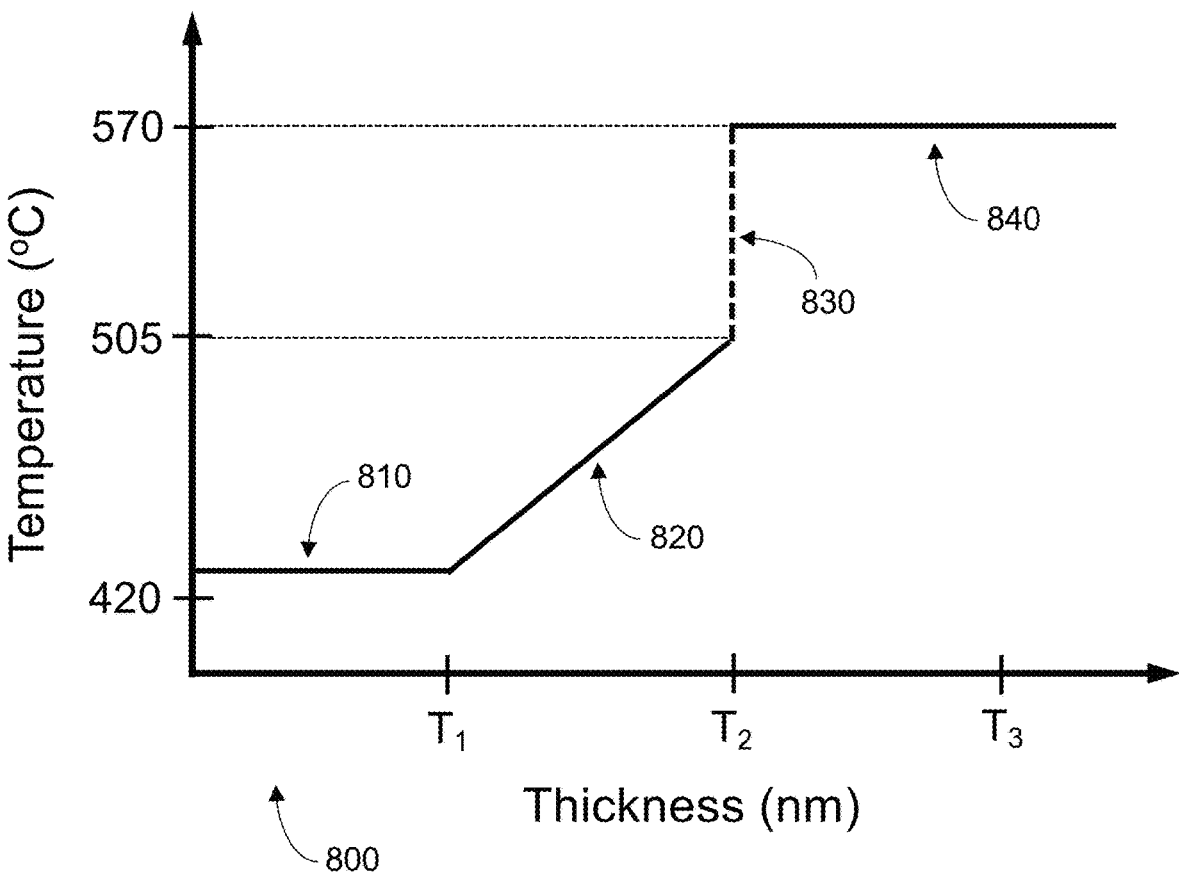
FIG. 8 illustrates a growth temperature profile according to various implementations of the invention.

FIG. 8 illustrates a growth temperature profile 800 according to various implementations of the invention. Growth temperature profile 800 plots a chamber temperature against a thickness of XBCO. During a first profile portion 810 of profile 800, optimized a-axis XBCO may be grown as a thin template layer at an initial temperature. In some implementations of the invention, this initial temperature may be in the range 400-500° C.; in some implementations of the invention, this initial temperature may be in the range 400-440° C.; in some implementations of the invention, this initial temperature may be in the range 410-430° C.; in some implementations of the invention, this initial temperature may be nominally 420° C.; other initial temperatures or temperature ranges may be used as would be appreciated. In some implementations of the invention, this thin template layer may be less than 20 nm in thickness; in some implementations of the invention, this thin template layer may be 10-20 nm in thickness; in some implementations of the invention, this thin template layer may be 1-10 nm in thickness; in some implementations of the invention, this thin template layer may be 1-5 nm in thickness; other thicknesses may be used as would be appreciated.

During a second profile portion 820, the chamber temperature may be ramped to an intermediate temperature without otherwise changing or disrupting crystal growth. In some implementations of the invention, the chamber temperature may be ramped to the intermediate temperature at a temperature ramp rate. In some implementations of the invention, the intermediate temperature may be 505° C., though other intermediate temperatures may be used as would be appreciated. In some implementations of the invention, the temperature ramp rate may be 10° C./nm, although the temperature ramp rate may range from 0.5° C./nm to 30° C./nm; other temperature ramp rates may be used, including varying temperature ramp rates, different temperature ramp rates, etc., as would be appreciated. In some implementations of the invention, the temperature ramp rate may be linear; in some implementations of the invention, the temperature ramp rate may be sublinear; or in some implementations of the invention, the temperature ramp rate may be superlinear. In some implementations of the invention, the temperature ramp may be non-linear. In some implementations of the invention, the temperature ramp may vary in stepwise fashion. In some implementations of the invention, the temperature may be a combination of any of the above.

During a third profile portion 830, beginning when the chamber temperature reaches the intermediate temperature and ending when the chamber temperature reaches a final growth temperature, the fluxes of the constituent atoms of XBCO (i.e., X, B, C) are turned off with only oxygen remaining on. In some implementations of the invention, the chamber temperature may be adjusted to the final growth temperature. In some implementations of the invention, the chamber temperature may be ramped to the final growth temperature at a second temperature ramp rate. In some implementations of the invention, the second temperature ramp rate may be the same or nominally similar to the temperature ramp rate during second profile portion 820; though other second temperature ramp rates may be used as would be appreciated. In some implementations of the invention, the final growth temperature may be 570° C., though other final growth temperatures or ranges of final growth temperatures may be used as would be appreciated.

During a fourth profile portion 840, beginning when the chamber temperature reaches the final growth temperature, the fluxes of the constituent atoms of XBCO (i.e., X, B, C)

are turned backed on. In some implementations of the invention, the chamber temperature remains constant at the final growth temperature until a desired thickness of XBCO is obtained as would be appreciated.

In some implementations of the invention, once the desired thickness of XBCO is obtained, a layer of $X_2BCO$ may be grown on top of the XBCO, where $X_2$ may be different from X. For example, a layer of PBCO may be grown on top of a layer of YBCO. In this example, PBCO may be grown on top of YBCO by exchanging the flux of yttrium with a flux of praseodymium. Further alternating layers or differing layers may be grown as would be appreciated.

Table 1 compares a-axis YBCO grown in accordance with various implementations of the invention with a-axis YBCO grown as described in the following papers: 1) Takeuchi et al., "Fabrication of in-plane aligned a-axis oriented YBa2Cu3O7-x trilayer Josephson junctions," *Appl. Phys. Lett.*, vol. 69, no. 1, pp. 112-114, 1996; 2) Trajanovic, et al., "Oxygen pressure dependence of the grain size and surface morphology in YBa 2 Cu 3 O 7-x a-axis films," *Appl. Phys. Lett.*, vol. 66, no. 12, pp. 1536-1538, March 1995; 3) Takeuchi et al., "Fabrication of all in-plane oriented a-axis YBa 2 Cu 3 O 7-x/insulator/YBa 2 Cu 3 O 7-x heterostructures," *Appl. Phys. Lett.*, vol. 66, no. 14, pp. 1824-1826, April 1995; and 4) Trajanovic, et al., "Growth Optimization and Characterization of a-axis Oriented Y—Ba—Cu—O Thin Films on (100) LaSrGaO4 Substrates," *IEEE Trans. Appl. Supercond.*, vol. 5, no. 2, pp. 1237-1240, 1995. Each of these papers was included in Appendix B of U.S. Provisional Application No. 63/035,162, which is one of the priority applications incorporated above. For purposes of clarity, these papers describe growing samples of YBCO in PLD on SLGO substrates.

TABLE 1

| | Comparision of Results | |
| --- | --- | --- |
| Measurement | YBCO-Takeuchi [1]-[4] | YBCO-Aspects of Invention |
| Roughness | 5 nm @ 380 nm thickness | 0.63 nm @ 40 nm thickness |
| Transition Temperature | 85K @ 50 nm | 89K @ 50 nm |
| % a-axis by XRD | >95% (beyond instrument precision) | >95% (in some cases >99%) |

FIG. 1 illustrates Josephson Junction (JJ) component layers 100 useful for describing various implementations of the invention. In various implementations of the invention, JJ component layers 100 may include two conducting layers 110 of a-axis $X_1BCO$ (Illustrated in FIG. 1 as a conducting layer 110A and a conducting layer 110B) and an insulating layer 120 of $X_2BCO$ between conducting layers 110. In some implementations, $X_2BCO$ may be oriented along an a-axis (i.e., a-axis $X_2BCO$) or oriented along another axis as would be appreciated. In some implementations, $X_1$ and $X_2$ are different elements (and hence, $X_1BCO$ and $X_2BCO$ are different materials) as would be appreciated. In some implementations, $X_1$ and $X_2$ are the same element, though $X_1BCO$ and $X_2BCO$ are arranged in different orientations (e.g., one a-axis and one c-axis, etc.). In some implementations, $X_1$ and $X_2$ are the same element, though $X_1BCO$ and $X_2BCO$ are arranged in the same general orientation, but with different angular offsets (e.g., one a-axis with 0° offset and one a-axis with 30° offset, etc.). In some implementations, each conducting layer 110 comprises a-axis YBCO and insulating layer 120 comprises PBCO, though other conducting layers and/or insulating layers may be used as would be appreciated. In some implementations, each conducting layer 110 comprises a-axis YBCO and insulating layer 120 comprises a-axis PBCO, though other conducting layers, insulating layers, and/or orientations may be used as would be appreciated.

As discussed above, thick conducting layers 110 are desired to facilitate fabrication of JJ components 100 with other semiconductor components using conventional semiconductor processes. For example, in some implementations, conducting layer 110A may have a desired thickness of 100 nm, or more. However, increasing the thickness of layers of a-axis XBCO (e.g., YBCO) often results in increasing surface roughness. For example, surface roughness of a-axis YBCO exceeds 2 nm for thicknesses of 100 nm, or more. Such surface roughness may not be conducive for fabricating JJ components 100 with other stacked semiconductor components.

Various implementations of the invention, in order to achieve, in effect, thicker layers of conducting layer 110A, employ an initial smoothing layer of c-axis XBCO beneath conducting layer 110A. C-axis XBCO does not suffer from increases in surface roughness as thickness increases to the degree that a-axis XBCO does. Thus, thicker layers of c-axis XBCO may be used to achieve a given surface roughness as compared with layers of a-axis XBCO.

Figure 2:
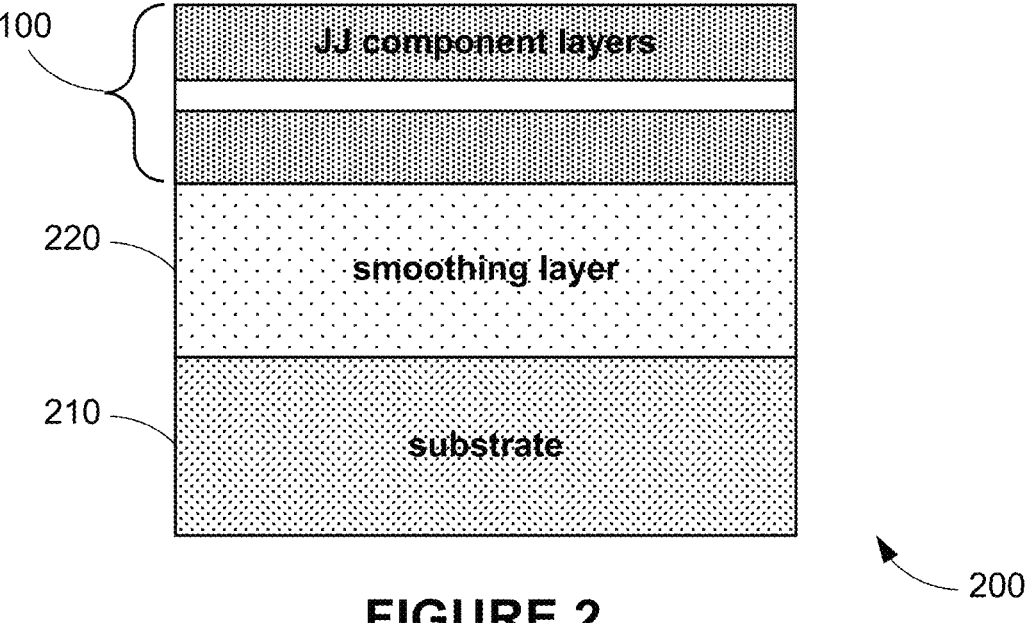
FIG. 2 illustrates a wafer of Josephson Junction component layers on top of a smoothing layer according to various implementations of the invention.

FIG. 2 illustrates a wafer 200 including JJ component layers 100 layered on top of a smoothing layer 220 and a substrate 210 according to various implementations of the invention. According to the invention, smoothing layer 220 may be used to increase an effective thickness of conducting layer 110A (i.e., a combined thickness of smoothing layer 220 and conducting layer 110A) without increasing surface roughness of conducting layer 110A. In some implementations of the invention, smoothing layer 220 comprises c-axis $X_1BCO$. In some implementations of the invention smoothing layer 220 comprises c-axis $X_nBCO$, where $X_1$ and $X_n$ are different elements (and hence $X_1BCO$ and $X_nBCO$ are different materials). In general, smoothing layer 220 may have a thickness of 1 nm to 1 μm, or more.

In some implementations of the invention, smoothing layer 220 may patterned, for example, via post-epitaxial etching, as a wiring layer as an added benefit. In implementations, where smoothing layer 220 comprises c-axis XBCO, superconducting currents may optimally flow in both horizontal directions, whereas in a-axis XBCO, superconducting currents optimally flow in only one horizontal direction along with a vertical direction as would be appreciated.

Figure 3:
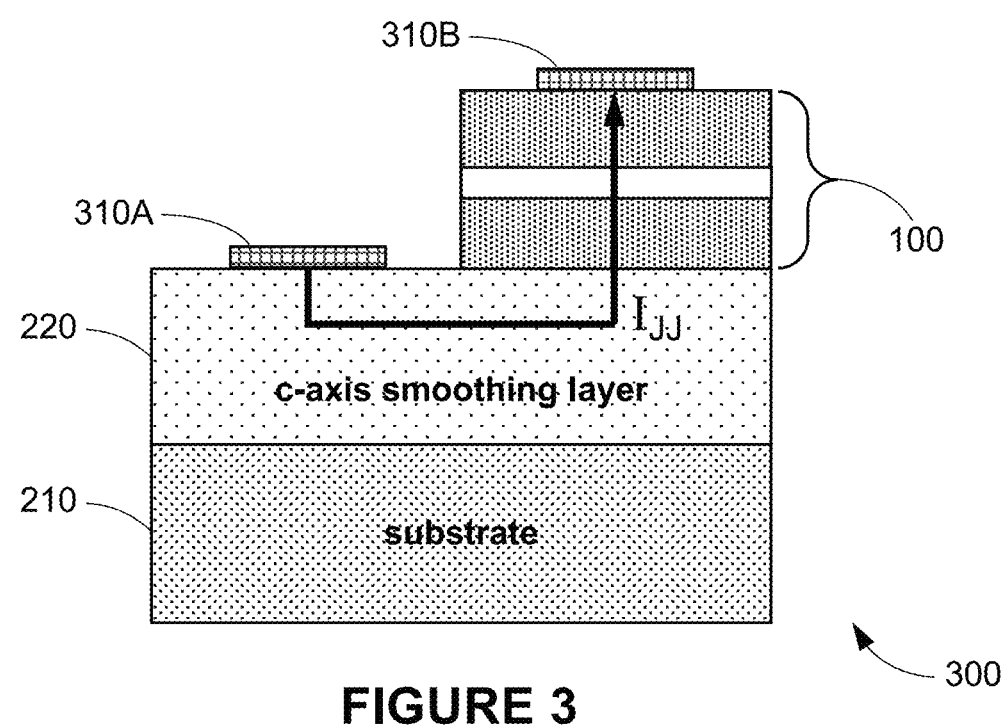
FIG. 3 illustrates an a-axis Josephson Junction according to various implementations of the invention.

FIG. 3 illustrates an a-axis Josephson Junction 300 according to various implementations of the invention. As illustrated, wafer 200 is etched (and more specifically, JJ component layers 100 of wafer 200 are etched) to partially reveal smoothing layer 220. Further processing lays down a terminal pad 310A on smoothing layer 220 and a terminal pad 310B on conducting layer 110B to provide electrical connections for a-axis Josephson Junction 300. According to various implementations of the invention, when in use, current applied to terminal pad 310A flows through smoothing layer 220 to conducting layer 110A, through conducting layer 110A, across insulating layer 120, and through conducting layer 110B to terminal pad 310B.

Figure 4:
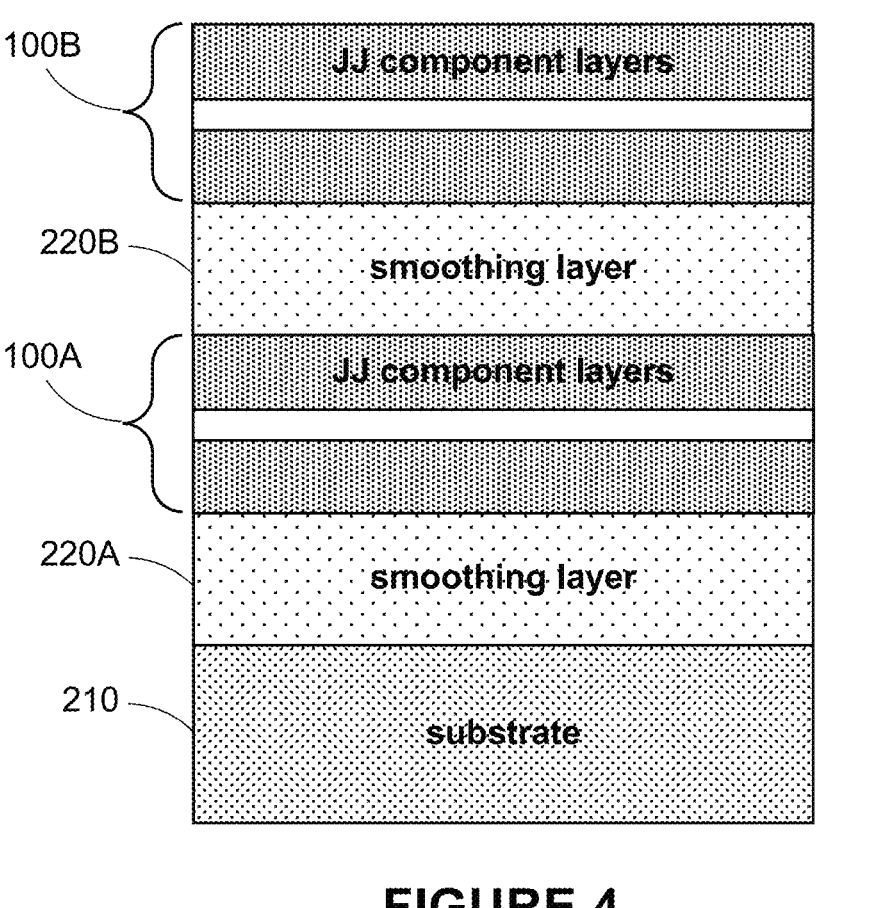
FIG. 4 illustrates a smoothing layer in between stacked Josephson Junction component layers according to various implementations of the invention.

FIG. 4 illustrates a stack 400 of JJ component layers 100 (illustrated as JJ component layers 100A and JJ component layers 100B) with an additional smoothing layer 220B disposed in between them according to various implementations of the invention. According to various implementations of the invention, any surface roughness found on top of first JJ component layers 100A may be reduced using smoothing layer 220B in preparation for second JJ component layers 100B. In this way, surface roughness introduced by each JJ component layers 100 are not cumulative through a given stack and may be mitigated by introducing intermediate smoothing layers 220 as would be appreciated.

Figure 5:
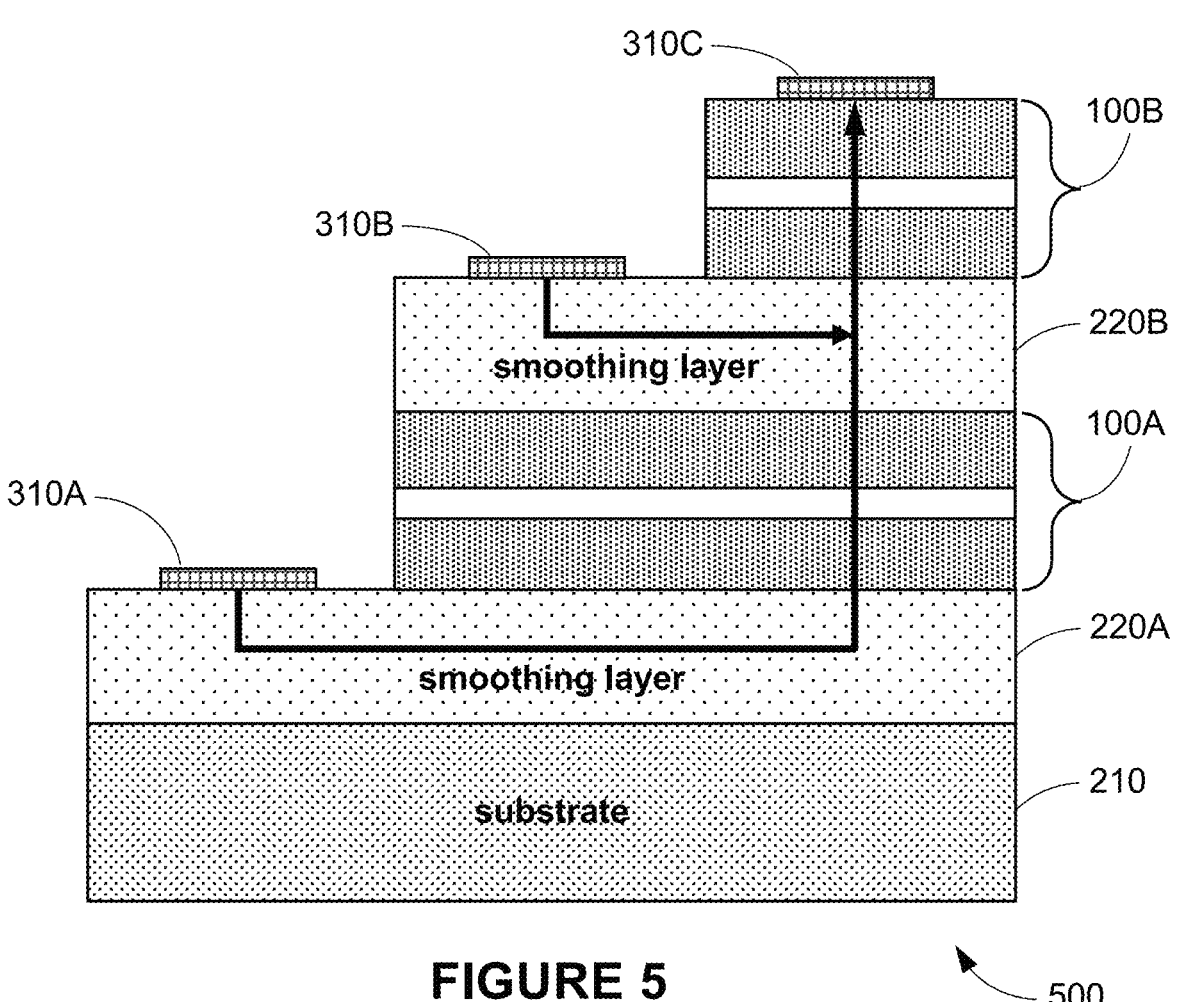
FIG. 5 illustrates multiple a-axis Josephson Junctions according to various implementations of the invention.

FIG. 5 illustrates an example stacked device 500 of a-axis Josephson Junctions according to various implementations of the invention. As illustrated, stack 400 is etched to partially reveal smoothing layer 220A and smoothing layer 220B. Further processing lays down a terminal pad 310A on smoothing layer 220A, a terminal pad 310B on smoothing layer 220B, and a terminal pad 310C on top of JJ component layers 100B to provide electrical connections for two a-axis Josephson Junctions. Other configurations and numbers of Josephson Junctions may be used as would be appreciated.

Figure 6:
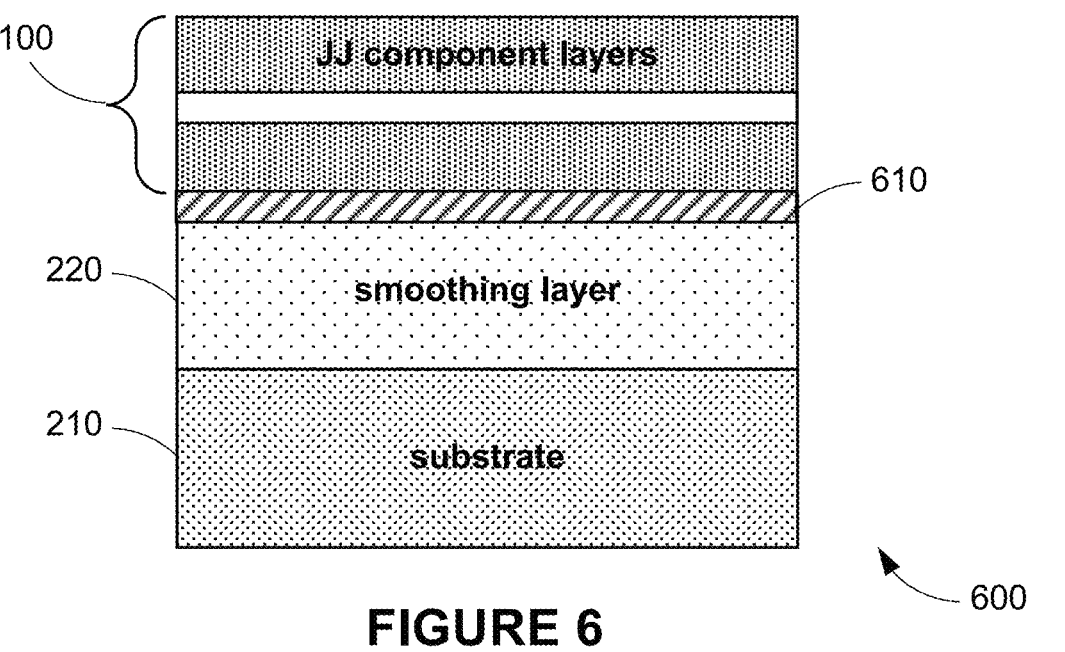
FIG. 6 illustrates a wafer of Josephson Junction component layers on top of a smoothing layer, with a transition layer disposed in between, according to various implementations of the invention.

FIG. 6 illustrates a wafer 600 of JJ component layers 100 on top of a smoothing layer 220, with a transition layer 610 disposed in between JJ component layers 100 and smoothing layer 220, according to various implementations of the invention. In some implementations of the invention, transition layer 610 comprises a mix of materials, or mix of material orientations, as the respective layers transition between smoothing layer 220 (e.g., a layer of c-axis XBCO) and conducting layer 110A (e.g., a layer of a-axis XBCO). In some implementations of the invention, transition layer 610 may have a thickness of approximately 1 nm; though in other implementations, transition layer 610 may have a thickness of 20 nm or more, depending on quality of growth of the materials as would be appreciated. In some implementations, transition layer 610 may provide passive electrical functions, such as impedance and/or capacitance as would be appreciated.

Figure 7:
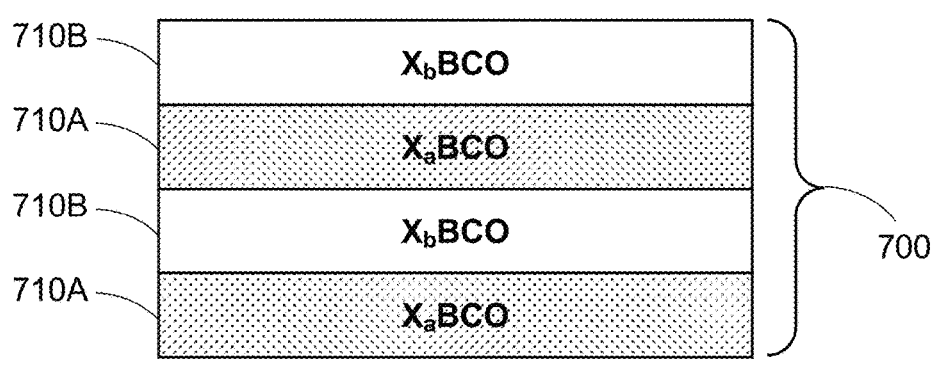
FIG. 7 illustrates a superlattice according to various implementations of the invention.

In some implementations of the invention, a superlattice 700 comprised of different layers 710 of materials may be constructed as illustrated in FIG. 7. In some implementations, superlattice 700 may be used in place of any layer or combination of layers referenced above. In some implementations of the invention, superlattice 700 may comprise any number of layers 710A formed in a pattern alternating between layer 710A and layer 710B. While illustrated as having alternating layers 710 of two different materials, such configuration of superlattice 700 is not necessary, and any number of different and/or alternating layers 710 or patterns of layers 710 may be used as would be appreciated. In some implementations of the invention, superlattice 700 may comprise any number of the same or different insulating layers 710. In some implementations of the invention, superlattice 700 may comprise any number of the same or different conducting layers 710. In some implementations of the invention, superlattice 700 may comprise any number of insulating and/or conducting layers 710 as would be appreciated. In some implementations, layers 710 may have a thickness of 1 nm to 50 nm or more, as would be appreciated.

In some implementations, layer 710A may be comprised of $X_aBCO$ and layer 710B may be comprised of $X_bBCO$. In some implementations, any number of different layers 710 may be used, each comprised of a different $X_aBCO$, repeating in pattern or otherwise. In some implementations, $X_aBCO$ is a different material than $X_bBCO$ (and/or $X_iBCO$, etc., as the case may be); for example, where $X_a$ is a different element that $X_b$ (and/or $X_i$, etc.). In some implementations, $X_aBCO$ and $X_bBCO$ (and/or $X_iBCO$, etc., as the case may be) may be the same material in a different orientation from one another; for example, where $X_aBCO$ is a material oriented in the a-axis and $X_bBCO$ is the same material oriented in the b-axis, or where $X_aBCO$ is a material oriented in the b-axis and $X_bBCO$ is the same material oriented in the c-axis, or where $X_aBCO$ is a material oriented in the a-axis and $X_bBCO$ is the same material oriented in the c-axis. In some implementations, $X_aBCO$ and $X_bBCO$ (and/or $X_iBCO$, etc., as the case may be) may be the same material in a similar orientation with one another, but with a different offset; for example, where $X_aBCO$ is a material oriented along the a-axis with a 0° offset and $X_bBCO$ is the same material oriented along the a-axis with a 30° offset, or other offset as would be appreciated. In some implementations, $X_aBCO$ and $X_bBCO$ (and/or $X_iBCO$, etc., as the case may be) may be the same material with a different stoichiometry from one another. In some implementations, any combination of the foregoing differences between $X_aBCO$ and $X_bBCO$ may be used to form superlattice 700; for example, layer 710A may comprise a-axis $X_aBCO$ and layer 710B may comprise c-axis $X_bBCO$, where in addition to different orientations, elements $X_a$ and $X_b$ are also different elements. Other combinations of layers may be used as would be appreciated.

Example 1

To achieve the desired Y(Pr):Ba:Cu=1:2:3 composition ratio in the deposited $Y(Pr)Ba_2Cu_3O_{7-x}$ films, these elements are assumed to have a sticking coefficient of unity for the growth conditions used for $Y(Pr)Ba_2Cu_3O_{7-x}$. Under this assumption, the individual fluxes of yttrium, praseodymium, barium, and copper are established by synthesizing epitaxial films of their respective binary oxides individually, and either x-ray reflectivity (XRR) or RHEED oscillations are used to determine the thicknesses of these calibration films. From the measured film thickness and assuming (1) unity sticking coefficients of these cations for the growth conditions used to grow the binary oxide calibration films and (2) that these calibration films are fully relaxed and have the bulk density of these binary oxides, the respective elemental fluxes are calculated. Having established the elemental fluxes under the assumptions stated, the temperatures of the MBE effusion cells containing yttrium, praseodymium, barium, and copper are adjusted until the binary oxide calibration films grown with these sources indicate that the desired 1:2:3 flux ratio among Y(Pr):Ba:Cu. At this point, the growths of $Y(Pr)Ba_2Cu_3O_{7-x}$ and $YBa_2Cu_3O_{7-x}$/$PrBa_2Cu_3O_{7-x}$/$YBa_2Cu_3O_{7-x}$ trilayers commence. These binary oxide flux calibrations may be performed each day, immediately prior to the growth of $Y(Pr)Ba_2Cu_3O_{7-x}$ and $YBa_2Cu_3O_{7-x}$/$PrBa_2Cu_3O_{7-x}$/$YBa_2Cu_3O_{7-x}$ trilayers to achieve the growth of stoichiometric films. The demonstrated success in growing phase-pure $Y(Pr)Ba_2Cu_3O_{7-x}$ thin films and $YBa_2Cu_3O_{7-x}$/$PrBa_2Cu_3O_{7-x}$/$YBa_2Cu_3O_{7-x}$ trilayers attests to the validity of the assumptions made in this calibration procedure.

The conditions used to grow each of the binary oxides—$Y_2O_3$, $PrO_2$, BaO, and CuO—are outlined in Table 2. Also shown are the substrates used and epitaxial orientations of the resulting binary oxide calibration films. In all cases, the oxidant used is distilled ozone (~80% $O_3$+20% $O_2$), i.e., the same oxidant and background pressure used for the growth of the subsequent $Y(Pr)Ba_2Cu_3O_{7-x}$ thin films and $YBa_2Cu_3O_{7-x}$/$PrBa_2Cu_3O_{7-x}$/$YBa_2Cu_3O_{7-x}$ trilayers. For $Y_2O_3$, $PrO_2$, and CuO the thickness of the calibration film is measured by XRR. For hydroscopic BaO, the RHEED oscillation periodicity corresponding to the smallest charge-neutral formula unit of BaO, which in the case of BaO is half of the cubic lattice constant of BaO, is used to calculate the barium flux. Examples of the RHEED patterns, RHEED oscillations, XRD $\theta$-$2\theta$ scans, and XRR scans for this calibration method are illustrated for each binary oxide in FIGS. 14-17. The orientation relationships of the binary oxide calibration layers are: (111) $Y_2O_3$||(111) YSZ and [$\bar{1}$10] $Y_2O_3$||[$\bar{1}$10] YSZ, (111) $PrO_2$||(111) YSZ and [$\bar{1}$10] $PrO_2$||[$\bar{1}$10] YSZ, (100) BaO||(100) $SrTiO_3$ and [100] BaO||[110] $SrTiO_3$, and (111) CuO||(100) MgO and [$\bar{1}$10] CuO||[$\bar{1}$10] MgO. (YSZ=$(ZrO_2)_{0.905}(Y_2O_3)_{0.905}$ (or 9.5 mol % yttria-stabilized zirconia.))

TABLE 2

Binary Growth Conditions

| Binary oxide | Substrate | Temperature (° C.) | Pressure (Torr) |
|---|---|---|---|
| (111) CuO | (100) MgO | Room Temperature | $1 \times 10^{-6}$ |
| (100) BaO | (100) $SrTiO_3$ | 600 | $1 \times 10^{-6}$ |
| (111) $Y_2O_3$ | (111) YSZ | 900 | $1 \times 10^{-6}$ |
| (111) $PrO_2$ | (111) YSZ | 900 | $1 \times 10^{-6}$ |

Figures 14A, 14B, 14C, 14D:
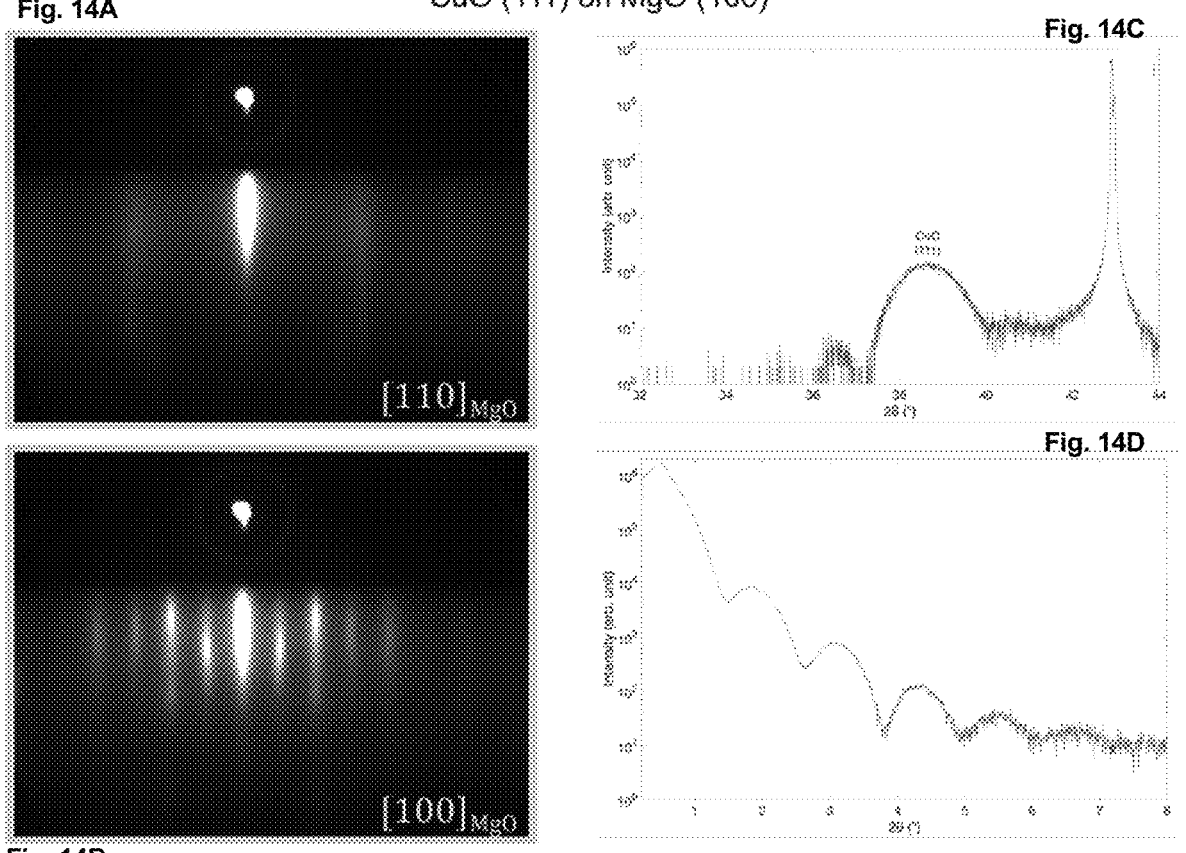
FIGS. 14A-14D generally illustrate growth of a CuO calibration film.

FIGS. 14A-14D generally illustrate growth of a CuO calibration film. FIGS. 14A and 14B illustrate RHEED patterns along the [110] and [100] azimuths of MgO. FIG. 14C illustrates $\theta$-$2\theta$ XRD scan and FIG. 14D illustrates x-ray reflectivity scan. The example illustrated corresponds to a 12.2 nm thick CuO calibration film.

Figures 15A, 15B, 15C:
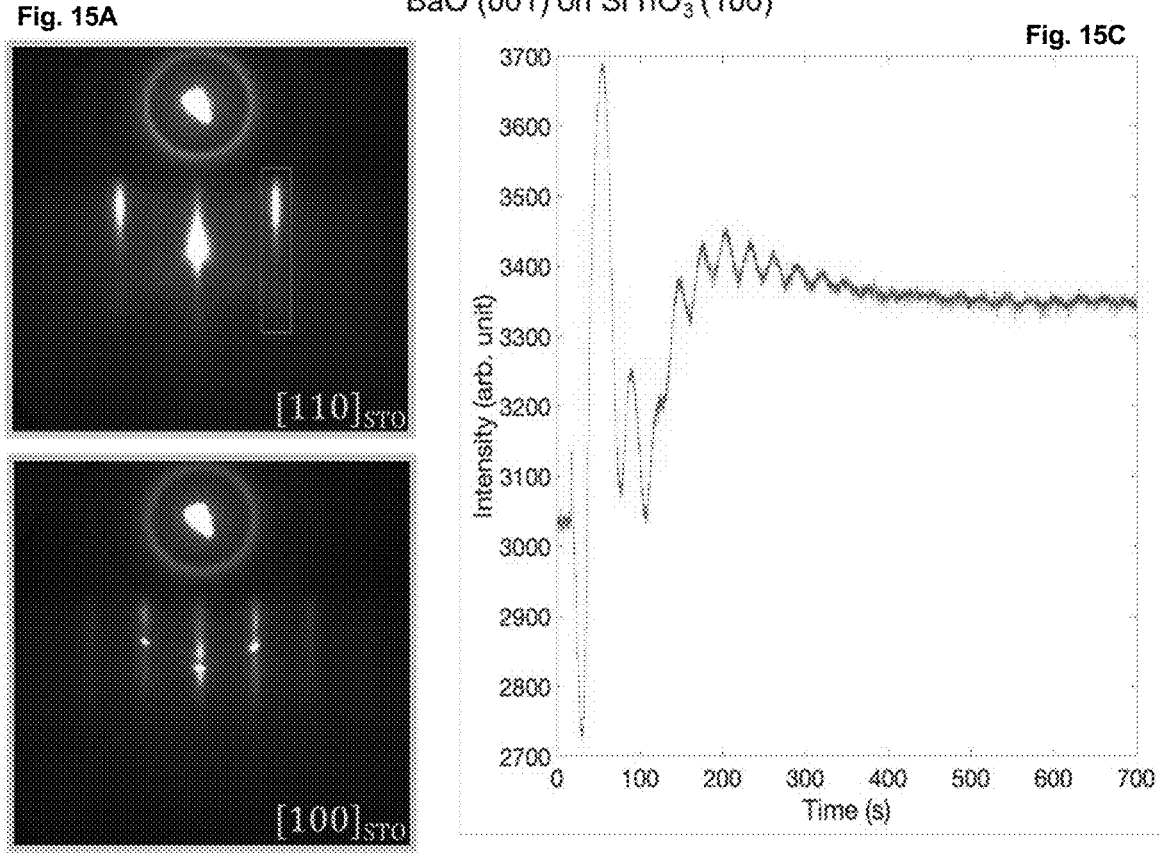
FIGS. 15A-15C generally illustrate growth of a BaO calibration film.

FIGS. 15A-15C generally illustrate growth of a BaO calibration film. FIGS. 15A and 15B illustrate RHEED patterns along the [110] and [100] azimuths of $SrTiO_3$. FIG. 15C illustrates RHEED oscillations of the diffracted streak from the outline red box showing layer-by-layer growth. The example illustrated corresponds to a 7 nm thick BaO calibration film.

Figures 16A, 16B, 16C, 16D:
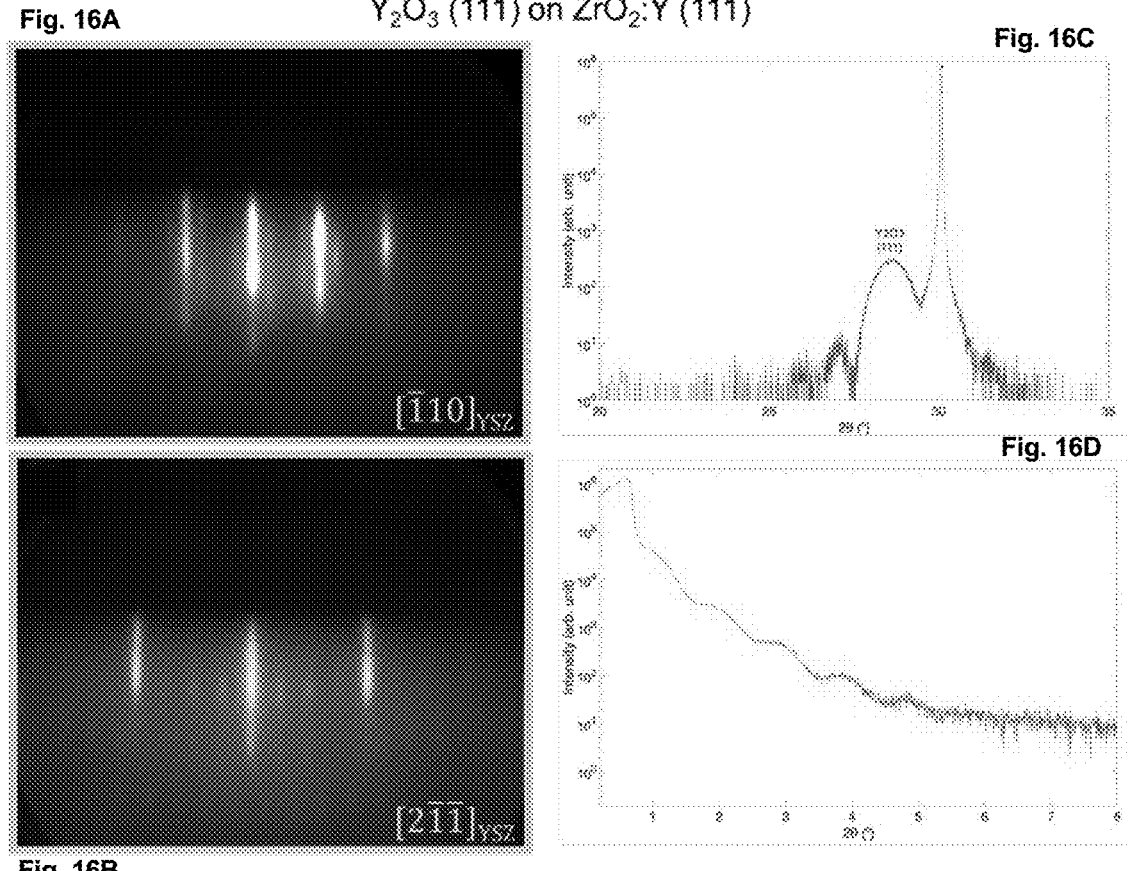
FIGS. 16A-16D generally illustrate growth of a $Y_2O_3$ calibration film.

FIGS. 16A-16C generally illustrate growth of a $Y_2O_3$ calibration film. FIG. 16A and FIG. 16B illustrate RHEED patterns along the [$\bar{1}$10] and [$2\bar{1}\bar{1}$] azimuths of YSZ. FIG. 16C illustrates a $\theta$-$2\theta$ scan and FIG. 16D illustrates a x-ray reflectivity scan. The example illustrated corresponds to a 11.5 nm thick $Y_2O_3$ calibration film.

Figures 17A, 17B, 17C, 17D:
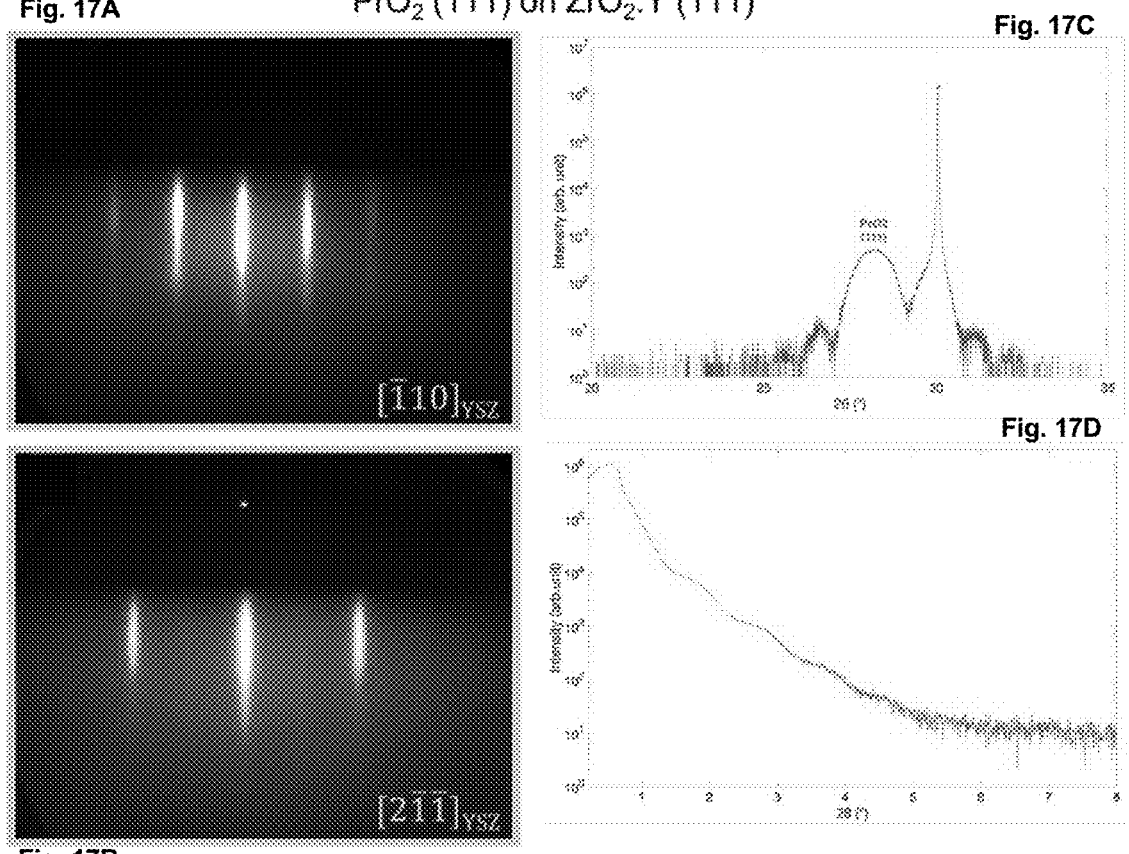
FIGS. 17A-17D generally illustrate growth of a $PrO_2$ calibration film.

FIGS. 17A-17D generally illustrate growth of a $PrO_2$ calibration film. FIG. 17A and FIG. 17B illustrate RHEED patterns along the [$\bar{1}$10] and [$2\bar{1}\bar{1}$] azimuths of YSZ. FIG. 17C illustrates a $\theta$-$2\theta$ scan and FIG. 17D illustrates a x-ray reflectivity scan. The example illustrated corresponds to a 11.1 nm thick $PrO_2$ calibration film.

Figures 18A, 18B, 18C, 18D:
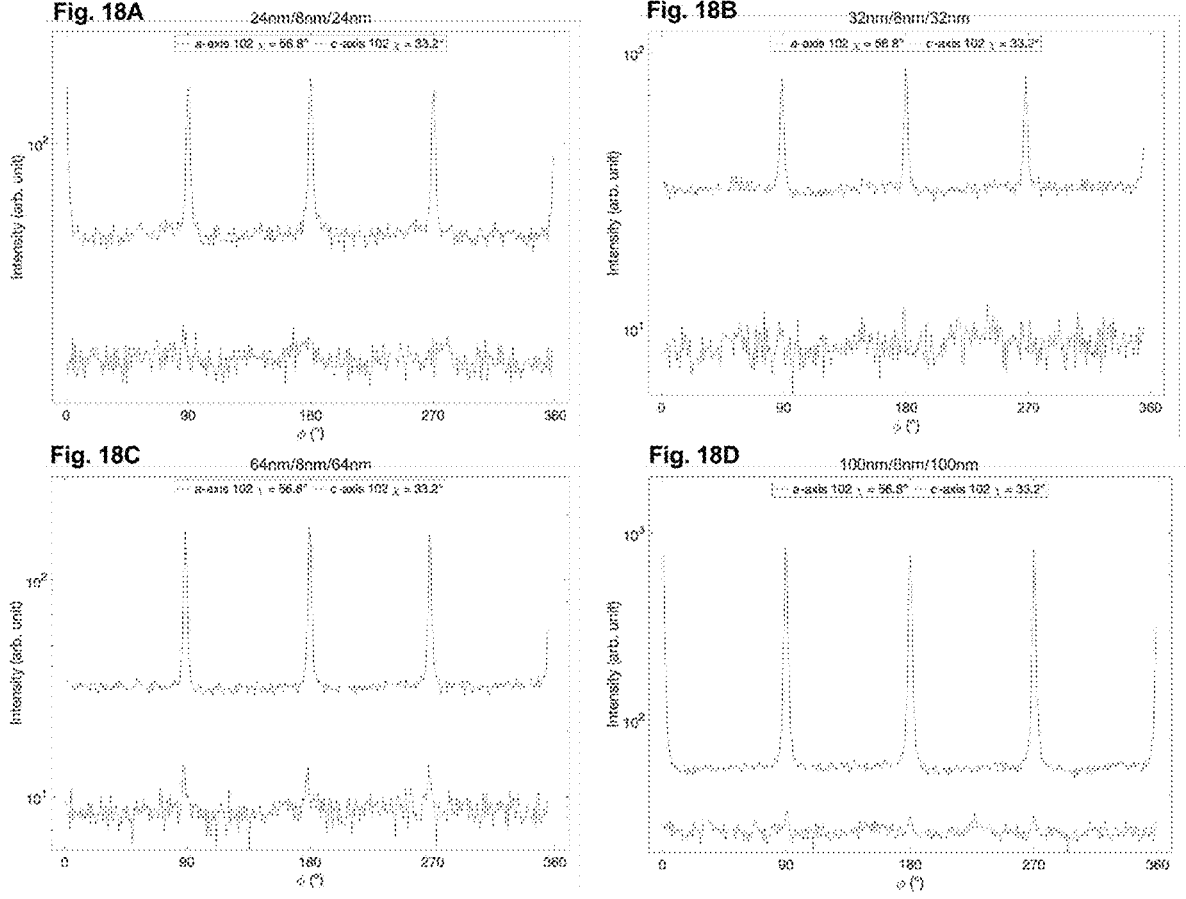
FIGS. 18A-18D generally illustrate off-axis φ scans of the 102 family of peaks for different thicknesses of YBCO/PBCO/YBCO trilayers.

FIGS. 18A-18D generally illustrate off-axis $\phi$ scans of the 102 family of peaks at $\chi$=56.8° (red) and $\chi$=33.2° (blue). FIG. 18A illustrates a scan for 24 nm/8 nm/24 nm $YBa_2Cu_3O_{7-x}$/$PrBa_2Cu_3O_{7-x}$/$YBa_2Cu_3O_{7-x}$ trilayers; FIG. 18B illustrates a scan for 32 nm/8 nm/32 nm $YBa_2Cu_3O_{7-x}$/$PrBa_2Cu_3O_{7-x}$/$YBa_2Cu_3O_{7-x}$ trilayers; FIG. 18C illustrates a scan for 64 nm/8 nm/64 nm $YBa_2Cu_3O_{7-x}$/$PrBa_2Cu_3O_{7-x}$/$YBa_2Cu_3O_{7-x}$ trilayers; and FIG. 18D illustrates a scan for 100 nm/8 nm/100 nm $YBa_2Cu_3O_{7-x}$/$PrBa_2Cu_3O_{7-x}$/$YBa_2Cu_3O_{7-x}$ trilayers. Peak area integration indicates that the volume fractions of a-axis oriented Y(Pr)$Ba_2Cu_3O_{7-x}$ in these trilayers are 97%, 97%, 96%, and 99%, respectively.

Figures 19A, 19B, 19C, 19D, 19E, 19F:
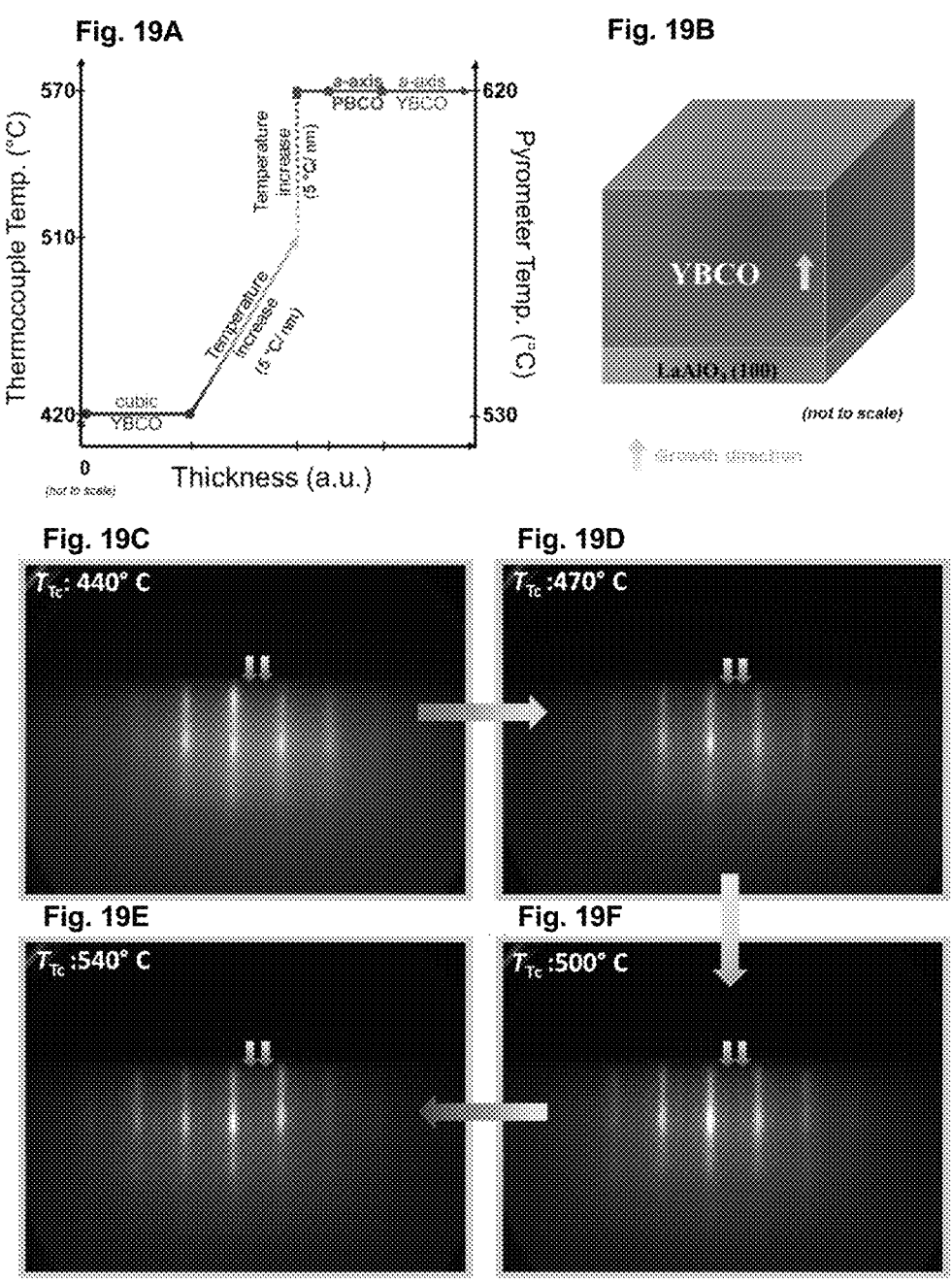
FIGS. 19A-19F generally illustrate a temperature ramping procedure and related RHEED patterns.

FIGS. 19A-19F generally illustrate the temperature ramping procedure and related RHEED patterns. FIG. 19A illustrates a four-step temperature-ramping method for the growth of the $YBa_2Cu_3O_{7-x}$/$PrBa_2Cu_3O_{7-x}$/$YBa_2Cu_3O_{7-x}$ trilayers. FIG. 19B illustrates a schematic of the $YBa_2Cu_3O_{7-x}$ layer grown on a (100) $LaAlO_3$ substrate.

Real-time RHEED images of a single $YBa_2Cu_3O_{7-x}$ layer acquired at four different temperatures during the temperature ramping procedure, i.e., at thermocouple temperatures of $T_{TC}$=440° C. (FIG. 19C), $T_{TC}$=470° C. (FIG. 19D), $T_{TC}$=500° C. (FIG. 19E), and $T_{TC}$=540° C. (FIG. 19F). The red arrows added to FIGS. 19C-19F point to the diffraction streaks associated with the c-axis of the $YBa_2Cu_3O_{7-x}$ lying in-plane. As the temperature is ramped, these streaks become more intense and sharper, demonstrating the enhanced crystalline quality of the a-axis oriented $YBa_2Cu_3O_{7-x}$ film during growth.

Figures 20A, 20B, 20C, 20D:
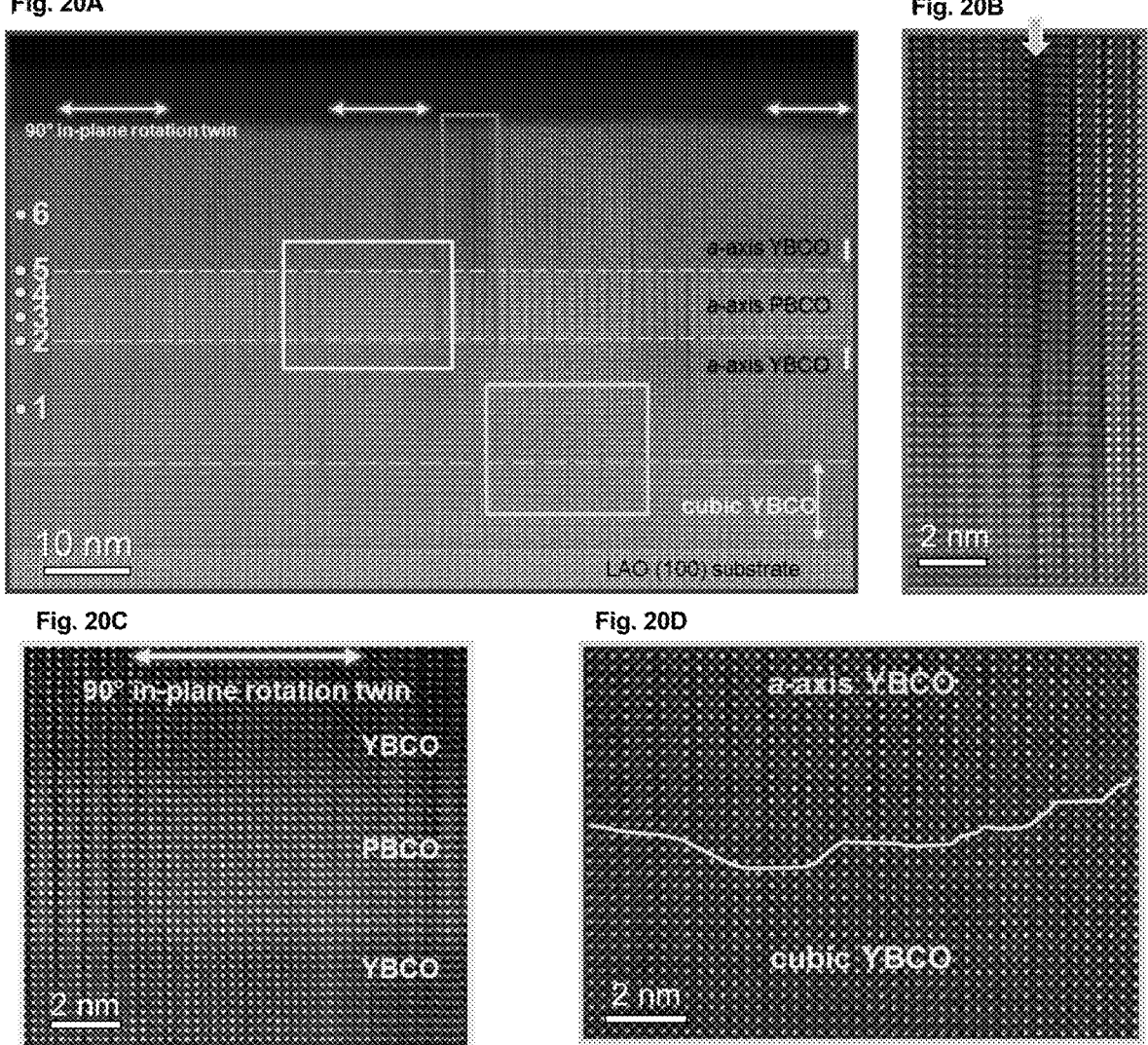
FIGS. 20A-20D generally illustrate cross-sectional high-resolution STEM images that reveal a microstructures of YBCO/PBCO/YBCO trilayers.

FIG. 20A illustrates a representative cross-sectional HAADF-STEM image of the 24 nm/8 nm/24 nm $YBa_2Cu_3O_{7-x}$/$PrBa_2Cu_3O_{7-x}$/$YBa_2Cu_3O_{7-x}$ trilayer highlighting aspects of the microstructure observed. The six (1-6) pink circles indicate the positions at which the RHEED patterns presented in FIG. 9A were taken during growth. The thickness of the cubic (Y,Ba)$CuO_{3-x}$ buffer layer is 10±2 nm. FIG. 20B illustrates a high-magnification HAADF-STEM image showing the region of interest highlighted by the green rectangle in FIG. 20A. The orange arrow indicates the intercalation of an additional CuO layer (dark feature) as a consequence of $YBa_2Cu_4O_{8-x}$ stacking faults with double-chain layers. FIG. 20C illustrates the high magnification view of the area highlighted by the gray rectangle in FIG. 20A and demonstrates the presence of $YBa_2Cu_3O_{7-x}$ and $PrBa_2Cu_3O_{7-x}$ in-plane rotation twins on top of the cubic (Y,Ba)$CuO_{3-x}$ layer that forms during the "cold" growth. The gray double-sided arrows mark the width of the 90° in-plane rotational twins. FIG. 20D illustrates the high magnification view of the area highlighted by the pink rectangle in FIG. 20A and shows the boundary between the cubic (Y,Ba)$CuO_{3-x}$ and the a-axis $YBa_2Cu_3O_{7-x}$ layer, marked by the pink line.

Figures 21A, 21B:
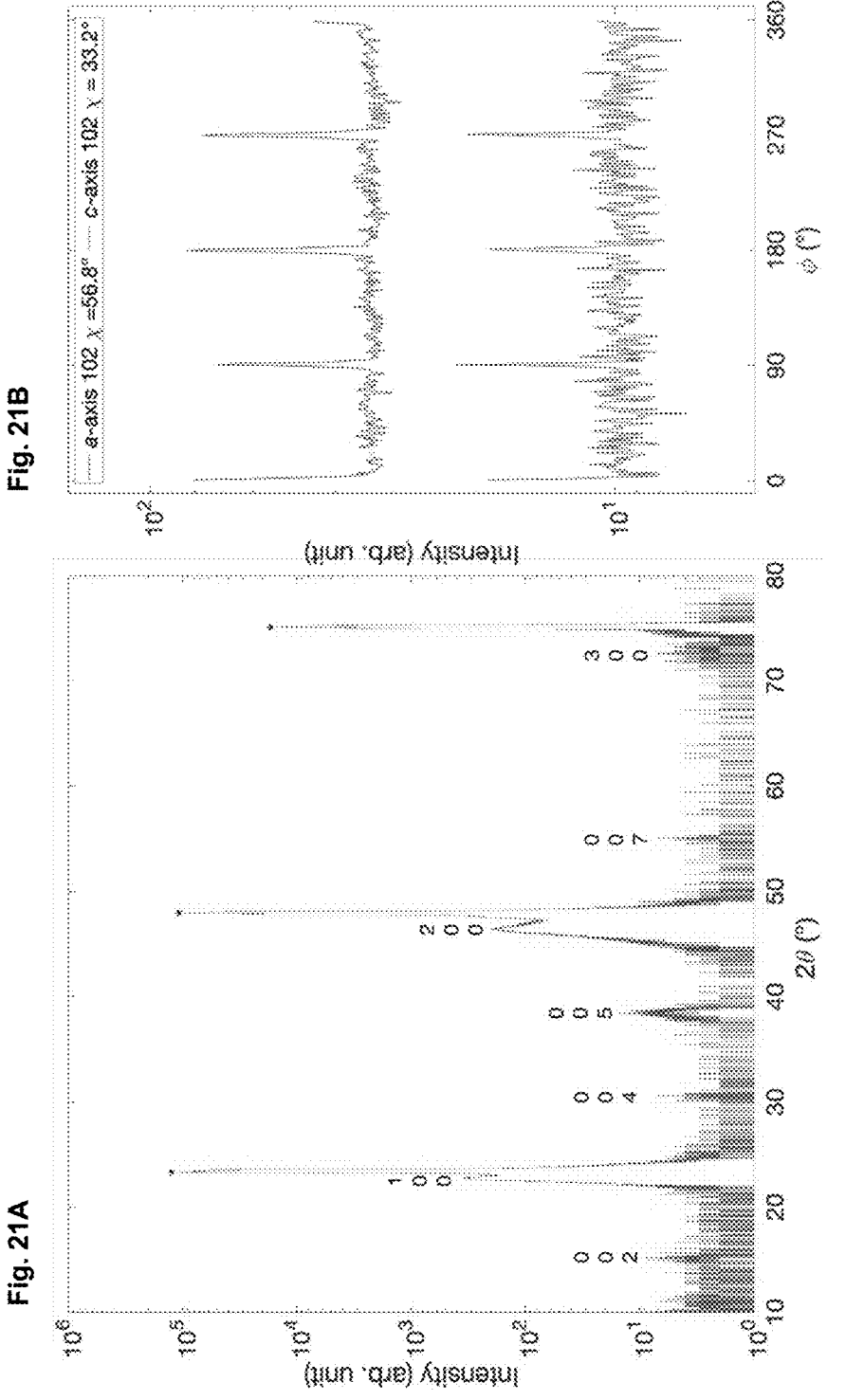
FIGS. 21A-21B generally illustrate XRD scans of a less-ideal YBCO/PBCO/YBCO trilayer.

FIGS. 21A-21B generally illustrate XRD scans of the less-ideal 32 nm/8 nm/32 nm $YBa_2Cu_3O_{7-x}$/$PrBa_2Cu_3O_{7-x}$/$YBa_2Cu_3O_{7-x}$ trilayer containing a higher concentration of c-axis grains. FIG. 21A illustrates a $\theta$-$2\theta$ scan and FIG. 21B illustrates an $\phi$ scan of the 102 family of peaks at $\chi$=56.8° (red) and $\chi$=33.2° (blue) of this less ideal trilayer indicate that it contains a volume fraction of 84% a-axis $YBa_2Cu_3O_{7-x}$.

Figure 22:
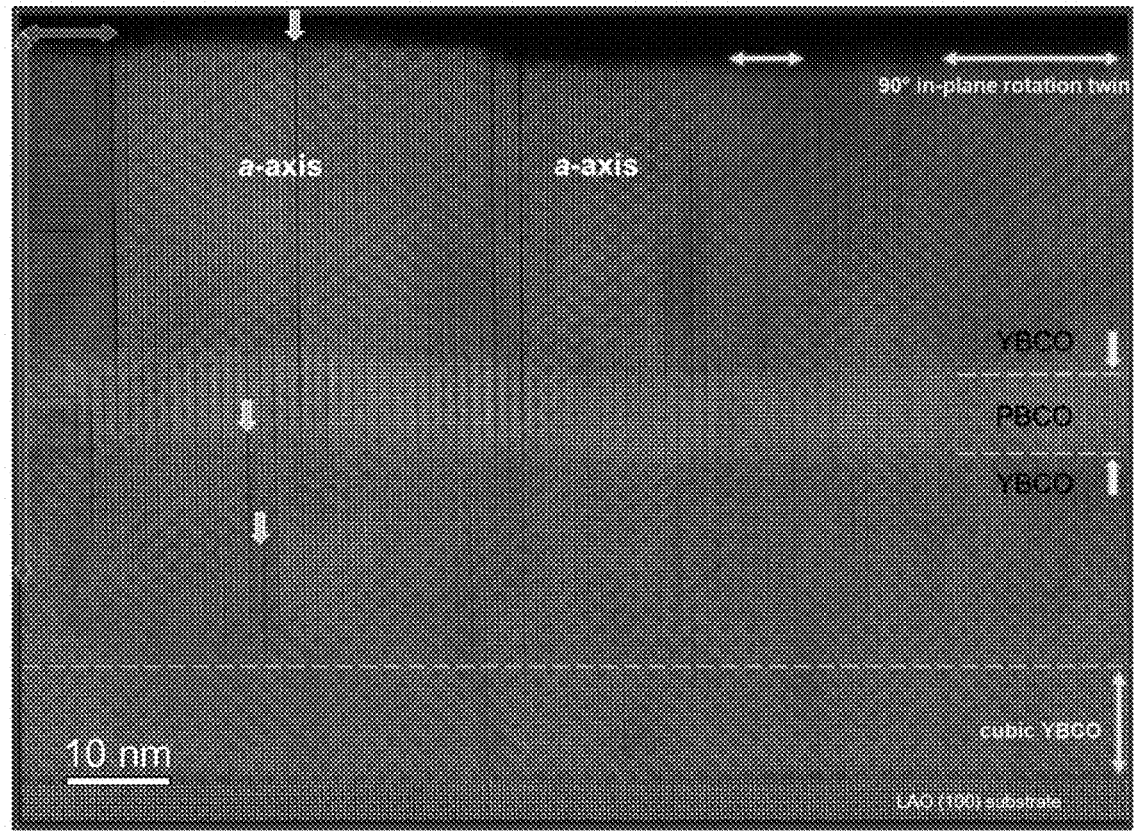
FIG. 22 generally illustrates cross-sectional high-resolution STEM images of a less-ideal YBCO/PBCO/YBCO trilayer.

FIG. 22 illustrates a representative cross-sectional HAADF-STEM image of the less-ideal 32 nm/8 nm/32 nm $YBa_2Cu_3O_{7-x}$/$PrBa_2Cu_3O_{7-x}$/$YBa_2Cu_3O_{7-x}$ trilayer showing increased roughness, c-axis and a-axis domains as well as $YBa_2Cu_4O_{8-x}$ stacking faults (dark lines), and a cubic (Y,Ba)$CuO_{3-x}$ buffer layer. The red arrows mark the c-axis domain that starts from the bottom cubic (Y,Ba)$CuO_{3-x}$ layer. The orange arrows indicate some of the $YBa_2Cu_4O_{8-x}$ stacking faults (features with darker contrast). The gray double-ended arrows mark the width of examples of 90° in-plane rotational twins in which the c-axis is oriented into the plane of the image. The thickness of the cubic-(Y,Ba)$CuO_{3-x}$ buffer layer is 11±2 nm.

Figures 23A, 23B, 23C, 23D, 23E, 23F, 23G:
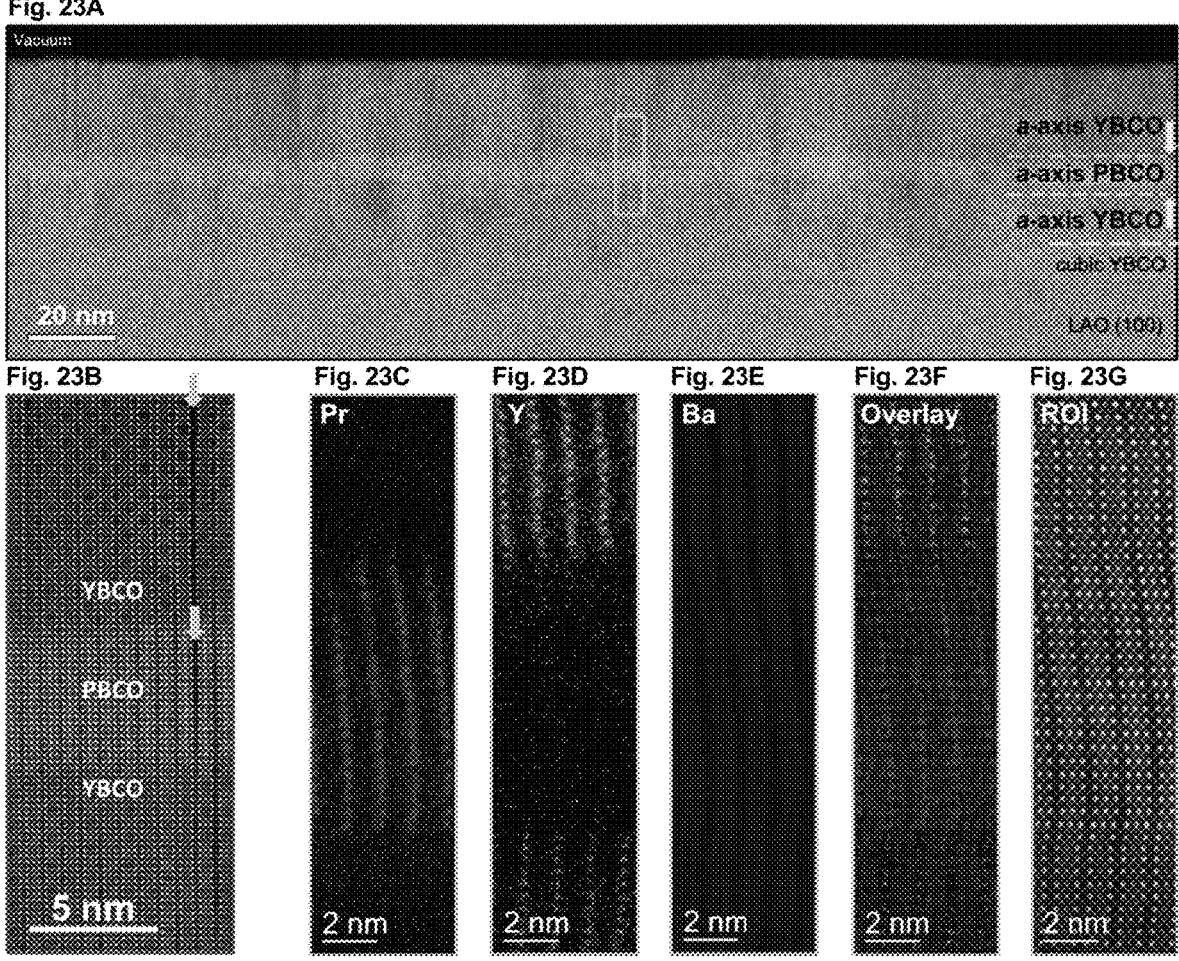
FIGS. 23A-23G generally illustrate a low-magnification cross-sectional high-resolution STEM images of a less-ideal YBCO/PBCO/YBCO trilayer.

FIG. 23A illustrates a low-magnification cross-sectional HAADF-STEM image of the same less-ideal 32 nm/8 nm/32 nm $YBa_2Cu_3O_{7-x}$/$PrBa_2Cu_3O_{7-x}$/$YBa_2Cu_3O_{7-x}$ trilayer exhibiting increased roughness. Individual $YBa_2Cu_3O_{7-x}$ and $PrBa_2Cu_3O_{7-x}$ layers are separated using dashed lines and the pink arrows indicate the nominal interfaces. FIG. 23B illustrates the high-magnification scan of a representative region demonstrates fairly abrupt interfaces and $YBa_2Cu_4O_{8-x}$ stacking faults as marked with orange arrows that either originate from the underlying $YBa_2Cu_3O_{7-x}$ or $PrBa_2Cu_3O_{7-x}$ layers. FIGS. 23C-23E illustrates atomically resolved Pr-$M_{5,4}$ edge (red), Y-$L_{3,2}$ edge (green), and Ba-$M_{5,4}$ edge (blue) elemental maps evidencing the sharp chemical abruptness of the interfaces. FIG. 23F illustrates the RGB overlay and FIG. 23G illustrates the simultaneously acquired ADF-STEM image showing this same region highlighted by the tan rectangle in FIG. 23A.

Example 2

An example of achieving low surface roughness for a-axis XBCO in accordance with various implementations of the invention, and the evaluation of such a-axis XBCO is described in a document entitled "a-axis $YBa_2Cu_3O_{7-x}$/$PrBa_2Cu_3O_{7-x}$/$YBa_2Cu_3O_{7-x}$ trilayers with subnanometer rms roughness," and in a document entitled "Supplementary Material, a-axis $YBa_2Cu_3O_{7-x}$/$PrBa_2Cu_3O_{7-x}$/$YBa_2Cu_3O_{7-x}$ trilayers with subnanometer rms roughness," (collectively "Smoothness Documents") each of which was included as Appendix Y of U.S. Provisional Application No. 63/105,230, entitled "A-axis Josephson Junctions with Improved Smoothness," filed on Oct. 24, 2020, which is one of the priority applications incorporated above. Growth temperature profile 800 and its associated temperatures appear to differ from corresponding profiles and temperatures in the Smoothness Documents because temperatures of growth temperature profile 800 are thermocouple temperatures whereas the temperatures described in the Smoothness Documents are pyrometer temperatures. As would be appreciated, these are two entirely different ways to measure temperature with each having its own inaccuracies. Despite the appearances due to different measurement sensors/techniques, actual temperatures are entirely consistent with one another.

In this example, a-axis $YBa_2Cu_3O_{7-x}$/$PrBa_2Cu_3O_{7-x}$/$YBa_2Cu_3O_{7-x}$ trilayers are grown on (100) $LaAlO_3$ substrates with improved interface smoothness. The trilayers are synthesized by ozone-assisted molecular-beam epitaxy. The thickness of the $PrBa_2Cu_3O_{7-x}$ layer is held constant at 8 nm and the thickness of the $YBa_2Cu_3O_{7-x}$ layers is varied from 24 nm to 100 nm. X-ray diffraction measurements show all trilayers to have >95% a-axis content. The rms roughness of the thinnest trilayer is <0.7 nm and this roughness increases with the thickness of the $YBa_2Cu_3O_{7-x}$ layers. The thickness of the $YBa_2Cu_3O_{7-x}$ layers also affects the transport properties: while all samples exhibit an onset of the superconducting transition at and above 85 K, the thinner samples show wider transition widths, $\Delta T_c$. High-resolution scanning transmission electron microscopy reveals coherent and chemically sharp interfaces, and that growth begins with a cubic (Y,Ba)$CuO_{3-x}$ perovskite phase that transforms into a-axis oriented $YBa_2Cu_3O_{7-x}$ as the substrate temperature is ramped up.

Figures 9A, 9B, 9C, 9D, 9E, 9F, 9G:
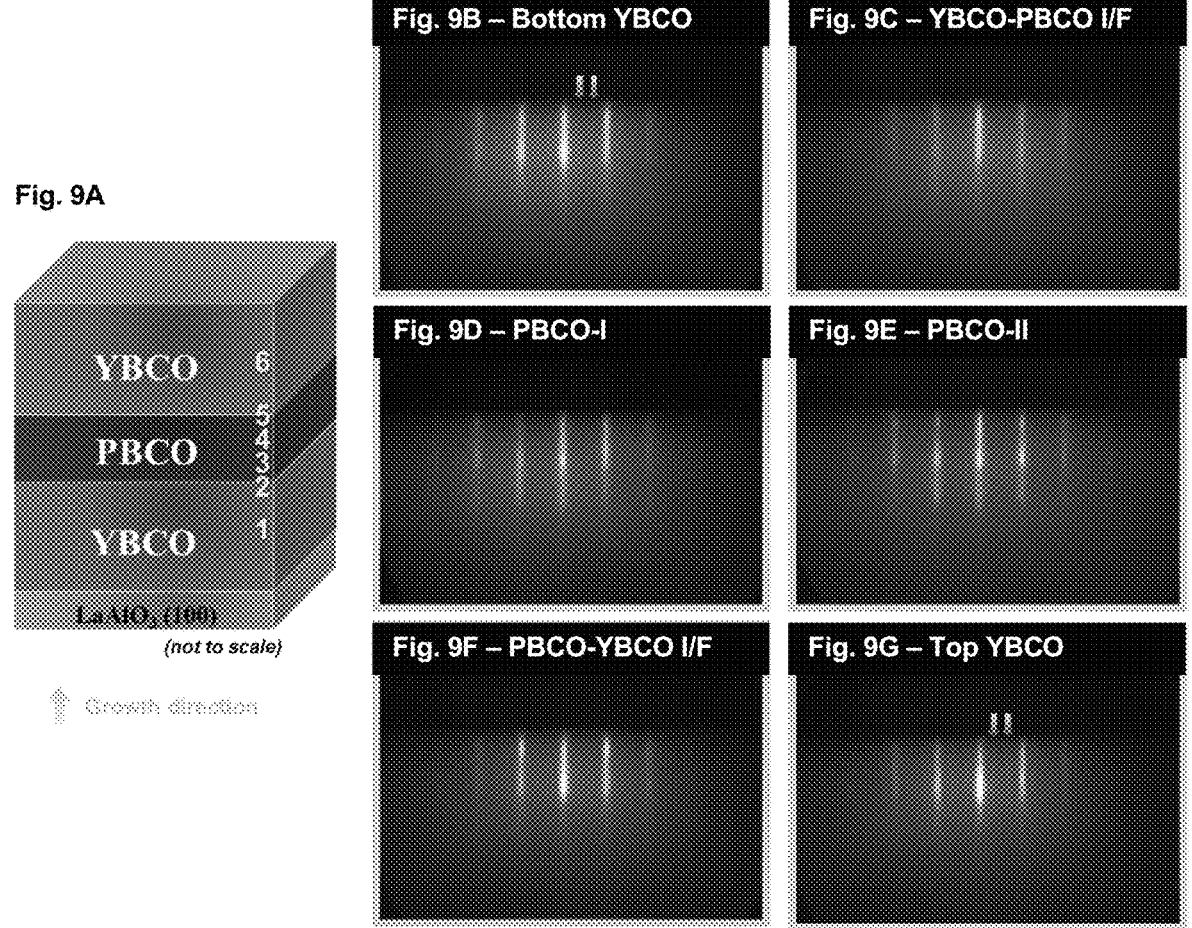
FIGS. 9A-9G illustrate YBCO/PBCO/YBCO trilayers grown on a substrates and their associated RHEED images.

$YBa_2Cu_3O_{7-x}$/$PrBa_2Cu_3O_{7-x}$/$YBa_2Cu_3O_{7-x}$ trilayers with 24 nm, 32 nm, 64 nm, and 100 nm thick $YBa_2Cu_3O_{7-x}$ layers, in which the $PrBa_2Cu_3O_{7-x}$ layer thickness is kept constant at 8 nm, were grown on 10 mm×10 mm (100)-oriented $LaAlO_3$ substrates by ozone-assisted MBE as illustrated in FIG. 9A. Although high quality a-axis $YBa_2Cu_3O_{7-x}$ films have been grown on (100) $LaSrGaO_4$ substrates, (100) $LaAlO_3$ substrates were used here to identify a path that can be scaled to large diameters to enable its translation to a viable technology. 3-inch diameter $LaAlO_3$ substrates are currently available; in the past, even 4-inch diameter $LaAlO_3$ substrates were commercially produced.

The $YBa_2Cu_3O_{7-x}$/$PrBa_2Cu_3O_{7-x}$/$YBa_2Cu_3O_{7-x}$ trilayers were synthesized in a Veeco GEN10 MBE. Yttrium (99.6%), barium (99.99%), praseodymium (99.1%), and copper (99.99%) were evaporated from thermal effusion cells with fluxes of $1.1\times10^{13}$ cm$^{-2}$ s$^{-1}$, $2.2\times10^{13}$ cm$^{-2}$ s$^{-1}$, and $3.3\times10^{13}$ cm$^{-2}$s$^{-1}$, respectively. Prior to growth, the (100) $LaAlO_3$ substrates (CrysTec GmbH) were etched in boiling water, annealed at 1300° C. in air for 10 hours, and then etched again in boiling water, to obtain an $AlO_2$-terminated surface with a step-and-terrace morphology. Following this surface treatment, the backside of the (100) $LaAlO_3$ substrates were coated with a 10 nm thick titanium adhesion layer followed by 200 nm of platinum, enabling the otherwise transparent substrates to be radiatively heated during MBE growth. The $YBa_2Cu_3O_{7-x}$ (or $PrBa_2Cu_3O_{7-x}$) layers were grown by simultaneously depositing yttrium (or praseodymium), barium, and copper onto the heated substrate under a continuous flux of distilled ozone (~80% $O_3$+20% $O_2$) yielding a background pressure of 1×10–6 Torr. After growth, the samples were cooled to under 100° C. in the same pressure of distilled ozone in which they were grown before turning off the ozone molecular beam and removing the samples from vacuum.

Because $YBa_2Cu_3O_{7-x}$ is a point compound that is unable to accommodate appreciable off-stoichiometry, flux calibration presents a significant challenge where secondary impurity phases nucleate easily and significantly degrade film quality. As discussed above, the flux of each element was separately calibrated by growing binary oxides of the constituents, namely $Y_2O_3$, $PrO_2$, BaO, and CuO. From these separate binary flux calibrations, the temperatures of the effusion cells containing yttrium, barium, praseodymium, and copper was adjusted to match the desired 1:2:3 flux ratio among Y(Pr):Ba:Cu. The temperature of the substrate was measured during growth by a thermocouple ($T_{Tc}$) that was positioned close to, but not in direct contact with the substrate, and by an optical pyrometer ($T_{Pyr}$) operating at a wavelength of 1550 nm. The growth of the trilayers started at low-temperature, $T_{Tc}\approx420°$ C. ($T_{Pyr}\approx530°$ C.), resulting in a cubic perovskite (Y,Ba)$CuO_{3-x}$ phase for the first few layers and ended at $T_{Tc}\approx570°$ C. ($T_{Pyr}\approx620°$ C.) following a temperature-ramping procedure. Details of the flux calibration method (including the characterization of individual binary oxides) are illustrated in FIGS. 14-18. The temperature-ramping details and the in-situ reflection high-energy electron diffraction (RHEED) characterization of a reference a-axis $YBa_2Cu_3O_{7-x}$ single-phase film grown as part of the optimization of the growth procedure are illustrated in FIG. 19.

During growth, the films were monitored by in-situ RHEED with KSA-400 software and a Staib electron gun operating at 13 kV and 1.45 A. RHEED images taken during the growth of the 24 nm $YBa_2Cu_3O_{7-x}$/8 nm $PrBa_2Cu_3$ $O_{7-x}$/24 nm $YBa_2Cu_3O_{7-x}$ trilayer are illustrated in FIGS. 9B-9G. The structural quality and the a-axis/c-axis ratio of the samples was explored using a PANalytical Empyrean x-ray diffractometer (XRD) at 45 kV and 40 mA with Cu Kai radiation (1.54057 Å). For surface morphological characterization of the films, ex situ atomic force microscopy (AFM) measurements were conducted using an Asylum Cypher ES Environmental AFM system. Resistance as a function of temperature measurements were carried out using a homemade four-point van der Pauw geometry system that slowly dips the samples into a Dewar of liquid helium.

Detailed investigations of the films were conducted using atomic-resolution scanning transmission electron microscopy (STEM). Cross-sectional TEM specimens were prepared by focused ion beam (FIB) lift-out with a Thermo Fisher Helios G4 UX Dual Beam system. The samples were imaged on an aberration-corrected FEI Titan Themis at 300 kV. STEM high-angle annular dark-field (HAADF) imaging was performed with a probe convergence semi-angle of 21.4 mrad and inner and outer collection angles from 68-340 mrad. STEM electron energy loss spectroscopy (EELS) measurements were performed on the same Titan system equipped with a 965 GIF Quantum ER and Gatan K2 Summit direct detector operated in electron counting mode, with a beam current of ~50 pA and scan times of 2.5 or 5 ms per 0.4 Å pixel. A multivariate weighted principal component analysis routine (MSA Plugin in Digital Micrograph) was used to decrease the noise level in STEM data.

FIG. 9A illustrates the $YBa_2Cu_3O_{7-x}/PrBa_2Cu_3O_{7-x}/YBa_2Cu_3O_{7-x}$ trilayers grown on (100) $LaAlO_3$ substrates. FIGS. 9B-9G illustrate real-time RHEED images acquired along the [010] azimuth of the (100) $LaAlO_3$ substrate during the growth of the 24 nm $YBa_2Cu_3O_{7-x}$/8 nm $PrBa_2Cu_3O_{7-x}$/24 nm $YBa_2Cu_3O_{7-x}$ trilayer at the six different levels illustrated in FIG. 9A. FIG. 9B illustrates the RHEED pattern from the bottom $YBa_2Cu_3O_{7-x}$ layer; FIG. 9C illustrates the RHEED pattern at the $YBa_2Cu_3O_{7-x}$/$PrBa_2Cu_3O_{7-x}$ interface; FIGS. 9D-9E illustrate the RHEED pattern for the $PrBa_2Cu_3O_{7-x}$ layer at different growth levels; FIG. 9F illustrates the RHEED pattern at the $PrBa_2Cu_3O_{7-x}$/$YBa_2Cu_3O_{7-x}$ interface; and FIG. 9G illustrates the RHEED pattern at the top $YBa_2Cu_3O_{7-x}$ layer. The red arrows added to FIGS. 9B and 9G point to the diffraction streaks associated with the c-axis of the $YBa_2Cu_3O_{7-x}$ lying in-plane.

Figures 10A, 10B, 10C:
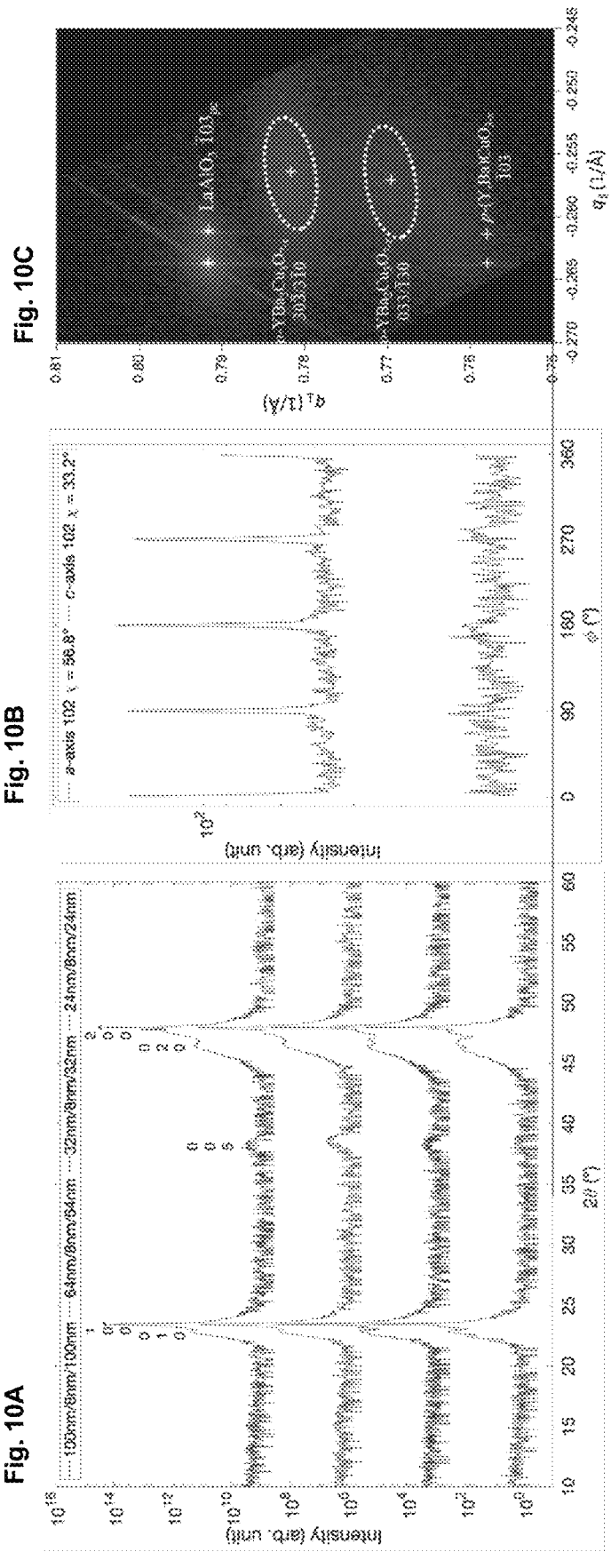
FIGS. 10A-10C generally illustrate x-ray diffraction of YBCO/PBCO/YBCO trilayers.

The structural quality of the samples was assessed by XRD measurements. Generally, FIGS. 10A-10C illustrate X-ray diffraction of $YBa_2Cu_3O_{7-x}/PrBa_2Cu_3O_{7-x}/YBa_2Cu_3O_{7-x}$ trilayers with 24 nm, 32 nm, 64 nm, and 100 nm thick $YBa_2Cu_3O_{7-x}$ layers. In FIG. 10A, θ-2θ scans of the trilayers show only h00, 0k0, and 00l reflections. In FIG. 10B, off-axis 102 reflection φ scans at χ=56.6° (red) and χ=33.4° (blue) of the trilayer with 24 nm thick $YBa_2Cu_3O_{7-x}$ layers showing the absence of c-axis grains. In FIG. 10C, RSM around the $LaAlO_3$ $\bar{1}03$ reflection (pseudocubic) of this same trilayer with 24 nm thick $YBa_2Cu_3O_{7-x}$ layers showing the a-axis and b-axis orthorhombic $30\bar{3}/3\bar{1}0$ and $033/\bar{1}30$ reflections of $YBa_2Cu_3O_{7-x}$, as well as the perovskite $(Y,Ba)CuO_{3-x}$ 103 reflection. The positions of these film reflections are indicated by the "+" symbols and dashed ellipses near the corresponding reflection labels.

In the coupled θ-2θ XRD scans in FIG. 10A, only h00, 0k0, and 00l reflections of the $YBa_2Cu_3O_{7-x}$ and $PrBa_2Cu_3O_{7-x}$ phases were indexed, indicating that the film only contains phases with the desired stoichiometry; they were free of impurity phases associated with off-stoichiometry. With increasing $YBa_2Cu_3O_{7-x}$ layer thicknesses, 00l reflections emerged showing the nucleation and propagation of c-axis grains in the films. Off-axis φ scans of the 102 family of reflections of the orthorhombic $YBa_2Cu_3O_{7-x}$/$PrBa_2Cu_3O_{7-x}$ at χ=56.6° and χ=33.4° were used to measure the a-axis and c-axis content of the orthorhombic grains, respectively. Note that χ=90 aligned the diffraction vector to be perpendicular to the plane of the substrate. In the 102 φ scan of the trilayer sample illustrated in FIG. 10B, four peaks associated with the a-axis grains were observed corresponding to 90° in-plane rotational twinning: the c-axis of the $YBa_2Cu_3O_{7-x}$ and $PrBa_2Cu_3O_{7-x}$ was aligned parallel to the [010] direction of the (100) $LaAlO_3$ substrate in one set of twin domains and parallel to the [001] direction of the (100) $LaAlO_3$ substrate in the other set of twin domains. No intensity associated with c-axis grains was observed indicating that the film contained no c-axis grains within the resolution of our XRD scan. The off-axis φ scans of all trilayer samples illustrated in FIGS. 18A-18D indicate that all four trilayers have more than 95% a-axis content in the $Y(Pr)Ba_2Cu_3O_{7-x}$ orthorhombic phase. In addition to the orthorhombic phases, a cubic perovskite phase was also observed. This phase has been previously reported in the literature as a low-temperature, kinetically-stabilized l-centered cubic phase or primitive simple-cubic phase. The formation of this phase and its role in stabilizing the a-axis $YBa_2Cu_3O_{7-x}/PrBa_2Cu_3O_{7-x}/YBa_2Cu_3O_{7-x}$ trilayers is discussed below in tandem with its observation by HAADF-STEM. In the reciprocal space map (RSM) around the $LaAlO_3$ 103 reflection (pseudocubic) in FIG. 10C, a perovskite-like 103 reflection (denoted p-$(Y,Ba)CuO_{3-x}$) and the orthorhombic phase $30\bar{3}/3\bar{1}0$ and $033/\bar{1}30$ reflections associated with the a-axis and b-axis $YBa_2Cu_3O_{7-x}$ grains, respectively, were observed.

Figures 11A, 11B, 11C, 11D, 11E:
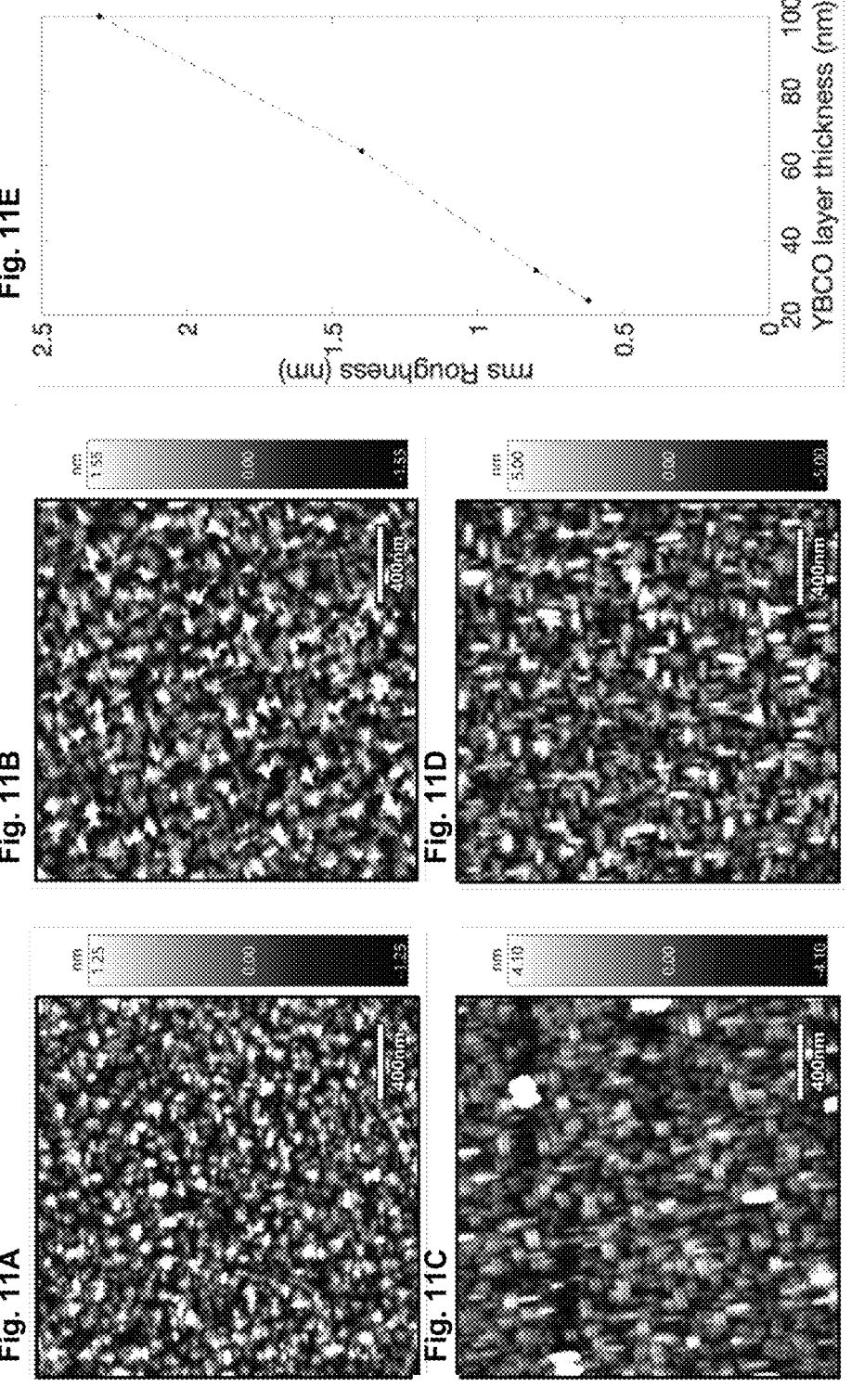
FIGS. 11A-11E generally illustrate surface morphology of the YBCO/PBCO/YBCO trilayers as revealed by AFM.

The surface morphologies of the same as-grown $YBa_2Cu_3O_{7-x}/PrBa_2Cu_3O_{7-x}/YBa_2Cu_3O_{7-x}$ trilayers were established by ex situ AFM in tapping mode. With increasing $YBa_2Cu_3O_{7-x}$ layer thickness, the elongated $YBa_2Cu_3O_{7-x}$ grains as well as the in-plane 90° rotational twinning of these rectangular-shaped features became visible in the 2 μm×2 μm topography scans as illustrated in FIGS. 11A-11E. FIGS. 11A-11E generally illustrates surface morphology of the $YBa_2Cu_3O_{7-x}/PrBa_2Cu_3O_{7-x}/YBa_2Cu_3O_{7-x}$ trilayers revealed by AFM. FIGS. 11A-11D illustrate 2 μm×2 μm topography scans of the 24 nm/8 nm/24 nm, 32 nm/8 nm/32 nm, 64 nm/8 nm/64 nm, and 100 nm/8 nm/100 nm trilayers in tapping mode, respectively. FIG. 11E illustrates rms roughness calculated from FIG. 11A-11D as a function of the $YBa_2Cu_3O_{7-x}$ layer thickness. The dotted line serves as a guide for the eye.

The surface morphology arose from the much slower growth rate of $YBa_2Cu_3O_{7-x}$ grains along [001] than in the (001) plane. The root-mean-square (rms) roughness also increased with increasing $YBa_2Cu_3O_{7-x}$ layer thickness from 0.62 nm in the thinnest 24 nm/8 nm/24 nm trilayer to 2.3 nm in the thickest 100 nm/8 nm/100 nm trilayer. Surface roughness is an important metric affecting the yield and electrical performance of $YBa_2Cu_3O_{7-x}$-based JJs involving extrinsic interfaces, i.e., tunnel barriers. The 0.62 nm rms roughness observed is the smoothest reported in the literature and a significant reduction from the 11.3 nm previously known on a-axis $YBa_2Cu_3O_{7-x}/PrBa_2Cu_3O_{7-x}$ bilayers with 270 nm thick $YBa_2Cu_3O_{7-x}$ layers grown on (100) $LaAlO_3$ substrate.

Figures 12A, 12B, 12C:
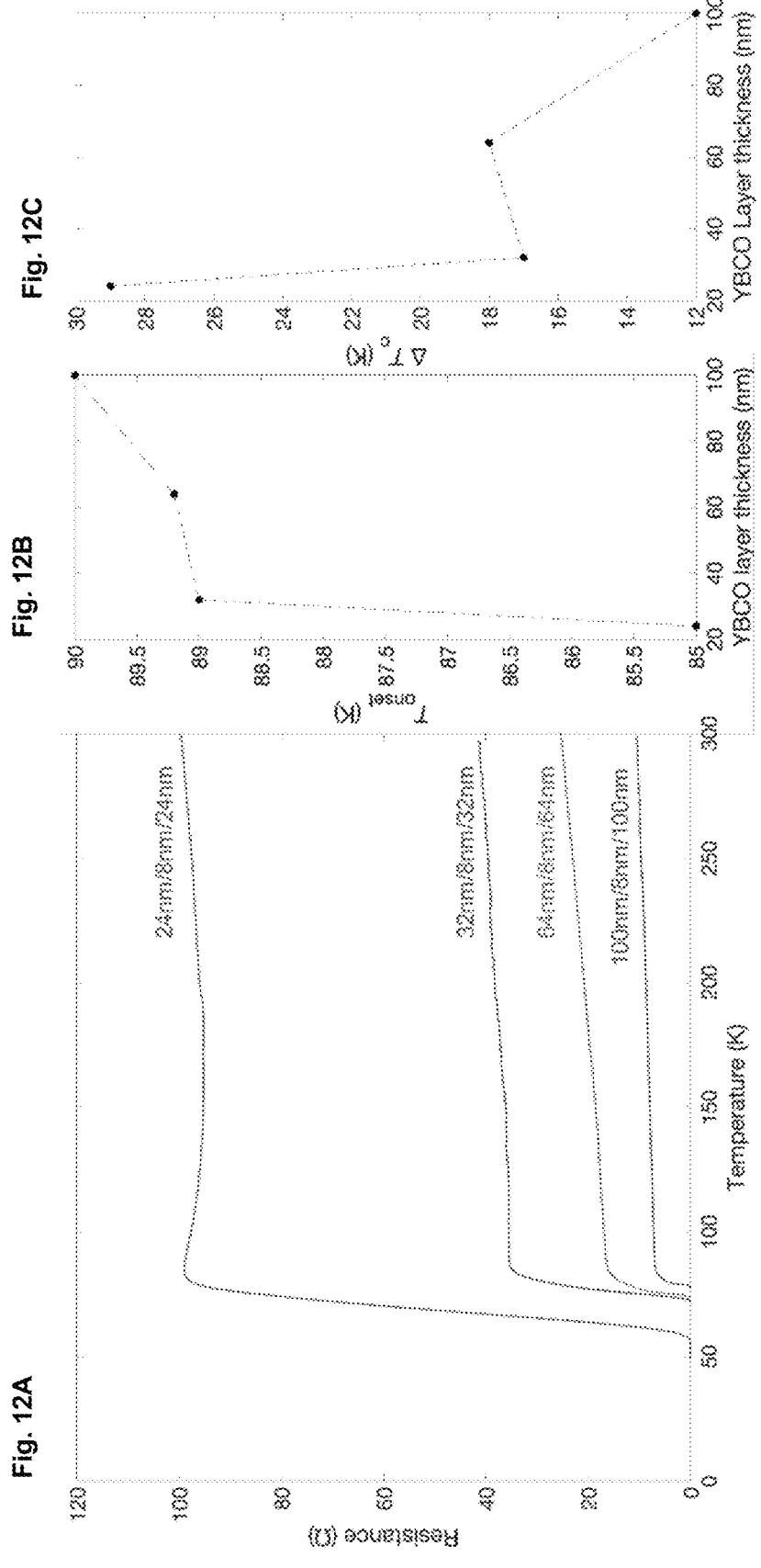
FIGS. 12A-12C generally illustrate transport properties of the YBCO/PBCO/YBCO trilayers.

FIGS. 12A-12C generally illustrate the transport properties of the same $YBa_2Cu_3O_{7-x}/PrBa_2Cu_3O_{7-x}/YBa_2Cu_3O_{7-x}$ trilayers. As is evident from the resistance versus temperature (R-T) plots in FIG. 12A, all trilayers were found to superconduct. As illustrated in FIG. 12B, the normal state resistance decreased and the onset temperature of the superconducting transition ($T_{onset}$) increased with increasing $YBa_2Cu_3O_{7-x}$ layer thickness from 85 K for the 24 nm/8 nm/24 nm trilayer to 90 K for the 100 nm/8 nm/100 nm trilayer. (The dashed lines in FIGS. 12B-12C are guides to the eye). $T_{onset}$ refers to the temperature at which the resistance falls below a linear extrapolation of the R vs. T behavior from its slope in the 200-300 K regime. The superconducting transition width ($\Delta T_c$), referred to here as the temperature difference between $T_{onset}$ and the temperature at which the resistance is zero (within the noise of our measurement), $\Delta T_c$, decreased with increasing $YBa_2Cu_3O_{7-x}$ layer thickness from 29 K for the 24 nm/8 nm/24 nm trilayer to 10 K for the 100 nm/8 nm/100 nm trilayer, as illustrated in FIG. 12C. Compared to c-axis $YBa_2Cu_3O_{7-x}$ films, however, these transition widths are still relatively broad. Such behavior is ubiquitous in twinned a-axis $YBa_2Cu_3O_{7-x}$ films especially when the thickness of the a-axis $YBa_2Cu_3O_{7-x}$ is under 100 nm. This may arise from local disorder and inhomogeneities in the samples, insufficient oxidation, or from the degradation of the samples over time.

Figures 13A, 13B, 13C, 13D, 13E, 13F, 13G:
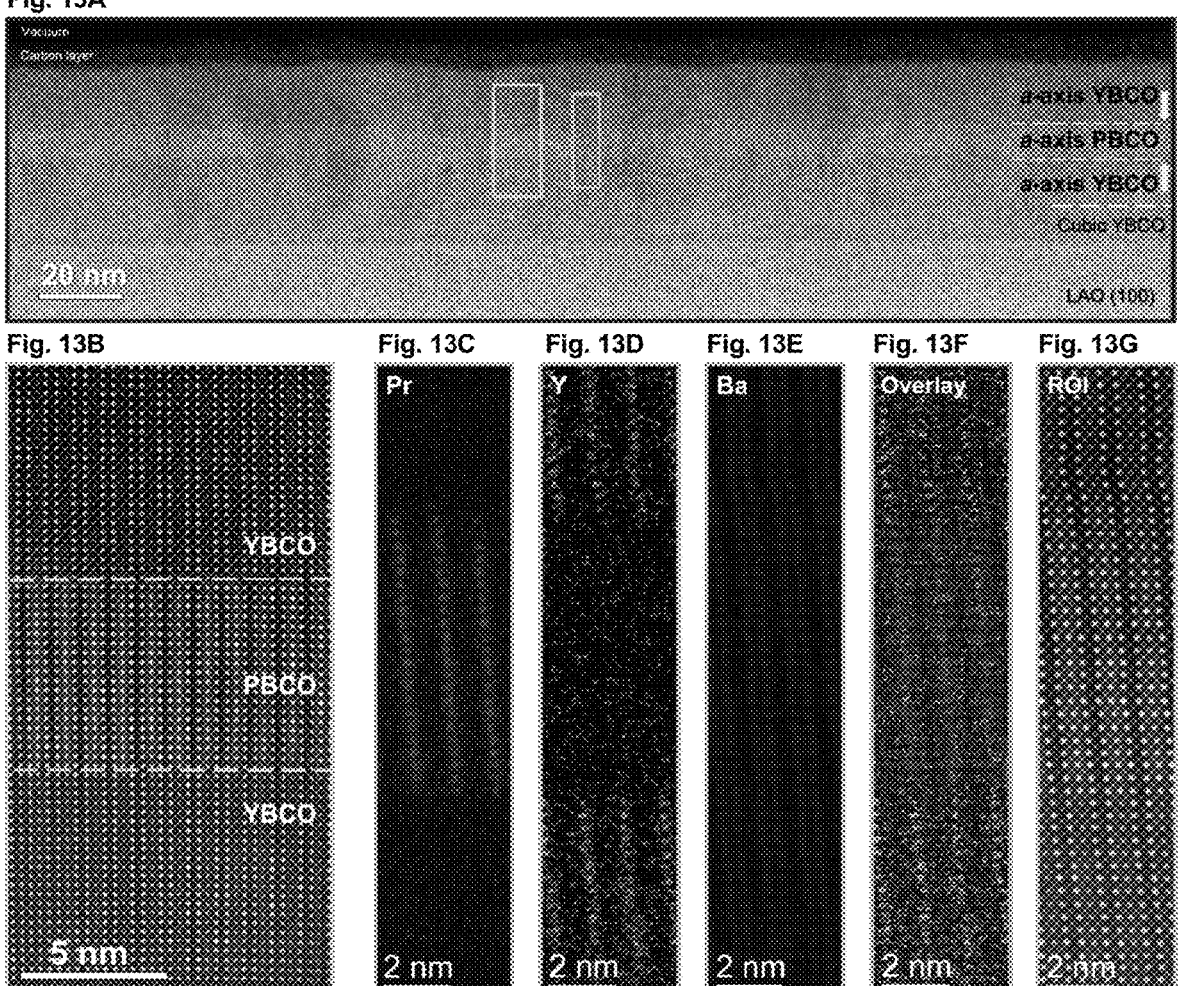
FIGS. 13A-13G generally illustrate cross-sectional high-resolution STEM images that reveal a microstructure and interface abruptness of the YBCO/PBCO/YBCO trilayers.

Two trilayer samples were studied with cross-sectional high-resolution STEM to reveal the microstructure and interface abruptness of the samples as illustrated in FIGS. 13A-13G. FIG. 13A illustrates a low-magnification cross-sectional HAADF-STEM image of the 24 nm/8 nm/24 nm $YBa_2Cu_3O_{7-x}/PrBa_2Cu_3O_{7-x}/YBa_2Cu_3O_{7-x}$ trilayer revealing the microstructure and interface abruptness at the atomic scale. Individual $YBa_2Cu_3O_{7-x}$ and $PrBa_2Cu_3O_{7-x}$ layers are separated using dashed lines and the pink arrows indicate the interfaces. FIG. 13B illustrates a high-magnification scan of the area highlighted by the orange rectangle in FIG. 13A, demonstrating that the interfaces are fully coherent. FIGS. 13C-13E illustrate atomically resolved $Pr-M_{5,4}$ edge (red), $Y-L_{3,2}$ edge (green), and $Ba-M_{5,4}$ edge (blue) elemental maps, respectively, evidencing the sharp chemical abruptness of the interfaces. FIG. 13F illustrates the RGB overlay and FIG. 13G illustrates the simultaneously acquired ADF-STEM image of the same region, outlined by the tan rectangle in FIG. 13A.

A low-magnification HAADF-STEM image of the 24 nm/8 nm/24 nm $YBa_2Cu_3O_{7-x}/PrBa_2Cu_3O_{7-x}/YBa_2Cu_3O_{7-x}$ trilayer, illustrated in FIG. 13A, is representative of the complete sample. Individual layers are distinguished as darker and brighter regions due to the atomic number (Z) contrast of HAADF imaging. The $PrBa_2Cu_3O_{7-x}$ layer gives brighter contrast compared to the $YBa_2Cu_3O_{7-x}$ layer because praseodymium ($Z_{Pr}=59$) is heavier than yttrium ($Z_Y=39$). The $LaAlO_3$ substrate also shows relatively bright contrast for the same reason ($Z_{La}=57$). A higher magnification image, illustrated in FIG. 13B, focusing on a representative interface region reveals that the interfaces in the $YBa_2Cu_3O_{7-x}/PrBa_2Cu_3O_{7-x}/YBa_2Cu_3O_{7-x}$ trilayer are coherent. In neither low-magnification nor in high-magnification scans were c-axis grains observed in these STEM images, consistent with the high volume fraction of a-axis growth measured by XRD. Nevertheless, structural coherence does not prove chemical abruptness at interfaces involving cuprate high-temperature superconductors.

The chemical abruptness of the $YBa_2Cu_3O_{7-x}/PrBa_2Cu_3O_{7-x}/YBa_2Cu_3O_{7-x}$ interfaces were assessed by atomic-resolution elemental mapping via STEM-EELS. FIGS. 13C-13E illustrate the elemental maps obtained using $Pr-M_{5,4}$ (red), $Y-L_{3,2}$ (green), and $Ba-M_{5,4}$ (blue) edges in the region outlined by the tan rectangle in FIG. 13A. A red, green, blue (RGB) overlay of the elemental maps from this region is illustrated in FIG. 13F, while FIG. 13G illustrates the simultaneously acquired ADF-STEM image of the same region. Atomic-resolution EELS maps reveal abrupt interface profiles, corroborating the STEM-HAADF images. Both interfaces show minimal Y—Pr intermixing, although some asymmetry of the interface profiles is seen. The lower $YBa_2Cu_3O_{7-x}/PrBa_2Cu_3O_{7-x}$ interface shows a nearly perfect interface profile free of Y—Pr intermixing; the upper interface ($PrBa_2Cu_3O_{7-x}/YBa_2Cu_3O_{7-x}$) presents a slightly rougher local profile with a roughness limited to 1-2 monolayers.

The roughness of the interfaces revealed by STEM and STEM-EELS in FIGS. 13A-13G is consistent with the qualitative observations made during growth by in situ RHEED (FIGS. 9B-9G) of this same $YBa_2Cu_3O_{7-x}/PrBa_2Cu_3O_{7-x}/YBa_2Cu_3O_{7-x}$ trilayer. The arrowed streaks of a-axis oriented $YBa_2Cu_3O_{7-x}$ in FIG. 9B promptly disappear in transitioning from the lower $YBa_2Cu_3O_{7-x}$ layer to the $PrBa_2Cu_3O_{7-x}$ barrier layer in FIG. 9C, indicating that the $PrBa_2Cu_3O_{7-x}$ barrier layer uniformly covers the lower $YBa_2Cu_3O_{7-x}$ layer. At the upper interface, however, it takes noticeably longer for the arrowed streaks of the upper $YBa_2Cu_3O_{7-x}$ layer to reappear (FIGS. 9F and 9G). Further, the time that it takes for the arrowed streaks of a-axis oriented $YBa_2Cu_3O_{7-x}$ to reappear in going from the $PrBa_2Cu_3O_{7-x}$ barrier to the $YBa_2Cu_3O_{7-x}$ upper layer takes progressively longer for the thicker trilayers. This is consistent with the increased surface roughness seen by AFM in FIGS. 11A-11E as the thickness of the $YBa_2Cu_3O_{7-x}$ layers increases.

In addition to the coherent and chemically sharp interfaces, some defects were observed by STEM. For example, intergrowths of an extra Cu—O layer intercalated into the $YBa_2Cu_3O_{7-x}$ structure to locally form $YBa_2Cu_4O_{8-x}$ (FIGS. 20A-20D) are seen. Such intergrown layers are well-known and common in $YBa_2Cu_3O_{7-x}$ in bulk, thin-films, and heterostructures.

The cross-sectional HAADF-STEM imaging also unveiled the location of the cubic perovskite$(Y,Ba)CuO_{3-x}$ phase detected in the XRD measurements. The thickness of the cubic $(Y,Ba)CuO_{3-x}$ layer is found to be 10 nm and it is located under the bottom $YBa_2Cu_3O_{7-x}$ layer (FIG. 20A). This cubic $(Y,Ba)CuO_{3-x}$ layer forms at the start of growth when the substrate is coldest and surface diffusion is most constrained. Yttrium and barium are unable to diffuse sufficiently far to establish the Y—Ba—Ba— . . . ordered arrangement found in the unit cell of $YBa_2Cu_3O_{7-x}$; instead yttrium and barium share the A-site of the resulting perovskite structure, with copper on the B-site.[47]

As the temperature of the substrate is ramped, the diffusion lengths increase, and in-plane structural order emerges. The resulting a-axis $YBa_2Cu_3O_{7-x}$ grains grow epitaxially in one of two symmetry equivalent orientations: with the c-axis parallel to either [010] or [001] of the cubic $(Y,Ba)CuO_{3-x}$ layer on which they nucleate on the (100) $LaAlO_3$ substrate. One set of such domains is clearly seen in FIGS. 20A-20D: the set with the c-axis along the horizontal direction of the image. The other set, with the c-axis oriented into the plane of the image, are more difficult to establish because their spacing along the horizontal direction is the same perovskite spacing as the cubic $(Y,Ba)CuO_{3-x}$ layer on which they nucleated.

The 10 nm thick cubic $(Y,Ba)CuO_{3-x}$ layer is believed to only lie under the a-axis oriented $YBa_2Cu_3O_{7-x}$ layer and the regions in which this perovskite structure appears to extend further, i.e., through and all the way to the surface of the trilayer, are actually the set of a-axis domains oriented with the c-axis running into the plane of the image. This is consistent with the grain size of the a-domains seen in the AFM images in FIGS. 11A-11D as well as published by others for a-axis $YBa_2Cu_3O_{7-x}$ grown on (100) $LaAlO_3$. From the XRD-scans (FIG. 10B and FIG. 18), there is an equal volume fraction of both 90° in-plane rotation twin variants, and although the volume sampled in this STEM investigation is small, this is also consistent with STEM observations. Once the substrate temperature is sufficiently high that the a-axis $YBa_2Cu_3O_{7-x}$ grains nucleate, both twin variants continue through the entire $YBa_2Cu_3O_{7-x}/PrBa_2Cu_3O_{7-x}/YBa_2Cu_3O_{7-x}$ trilayer.

Lastly, additional cross-sectional STEM investigations were performed on a less-ideal 32 nm/8 nm/32 nm sample in order to gain insights on the effect of c-axis grains in the trilayers. XRD shows the sample chosen to contain a higher volume fraction (16%) of c-axis oriented $YBa_2Cu_3O_{7-x}/$ $PrBa_2Cu_3O_{7-x}$ (FIG. 21) and to have a higher rms roughness than the 32 nm/8 nm/32 nm trilayer characterized in FIGS. 10-12. HAADF-STEM imaging (FIG. 22) of this less-ideal 32 nm/8 nm/32 nm trilayer confirms the presence of c-axis oriented grains in the structure and also demonstrates the rougher interfaces. Although the interfaces are rougher, STEM-EELS (FIG. 23) shows that they remain chemically abrupt. These results, when evaluated together, explain the rougher surfaces of the thicker samples. The c-axis grain formation in the bottom $YBa_2Cu_3O_{7-x}$ layer not only disturbs the $PrBa_2Cu_3O_{7-x}$ layer (and interface) profiles, but also directly influences the top surface roughness with changes in the local structural homogeneity in the first layers of the growth. The strong correlation between surface roughness and the volume fraction of c-axis grains in a-axis $YBa_2Cu_3O_{7-x}$ films has been previously noted. To avoid c-axis oriented $YBa_2Cu_3O_{7-x}$, growth is initiated at a substrate temperature where only cubic $(Y,Ba)CuO_{3-x}$ can nucleate.

In summary, a-axis $YBa_2Cu_3O_{7-x}/PrBa_2Cu_3O_{7-x}/$ $YBa_2Cu_3O_{7-x}$ trilayers were grown with improved structural quality. By leveraging a temperature-ramping procedure that begins with a cubic $(Y,Ba)CuO_{3-x}$ buffer layer, high-quality a-axis trilayers were grown as confirmed by ex-situ XRD measurements. AFM investigations revealed the improved surface quality with rms roughness that is less than $\xi_a$ for the thinnest $YBa_2Cu_3O_{7-x}/PrBa_2Cu_3O_{7-x}/YBa_2Cu_3O_{7-x}$ trilayers. STEM analyses unveiled the interrelation between c-axis oriented regions and surface roughness. Resistivity vs. temperature (R-T) measurements exhibited an onset of the superconducting transition at $T_{onset}$~85 K and also the widening of the superconducting transition width with decreasing $YBa_2Cu_3O_{7-x}$ film thickness. Sharp and coherent interfaces with limited elemental intermixing are evidenced by atomic-resolution HAADF-STEM and STEM-EELS. These findings demonstrate that precise control of the growth conditions results in sharp interfaces and smooth surfaces required in a-axis-based $YBa_2Cu_3O_{7-x}$ heterostructures, e.g., Josephson Junctions and other oxide electronics.

Example 3

In some implementations of the invention, various fabrication techniques are utilized to enhance operation and testing of the various Josephson Junctions described above. In some implementations of the invention, an ion mill etching depth is decreased to intentionally leave some PBCO insulator on top of the bottom YBCO layer. In some implementations of the invention, an ion mill etching angle is decreased to decrease a depth of any damage to the bottom YBCO layer introduced by the ion mill. In some implementations of the invention, an additional, larger Josephson Junction is connected in series with the Josephson Junction under test to act as a short to the bottom YBCO layer in implementations where PBCO covers the bottom YBCO; the larger Josephson Junction thus provides an indirect connection to the bottom YBCO layer. In some implementations, two or more of the fabrication techniques mentioned above are used in combination with one another as would be appreciated.

For example, in a trilayer comprised of 640 angstroms (Å) of YBCO (i.e., the top YBCO layer), 80 Å of PBCO, and 640 Å of YBCO (i.e., the bottom YBCO layer) on a LAO substrate, an ion mill etch rate was determined to be roughly 2 Å/s with an ion mill etch angle set at 90° (i.e., straight-on impact). In some implementations, in a first etching step of the trilayer, the ion mill etch angle may be set at 90° to remove the top YBCO layer; this etch angle provides the best aspect ratio, thereby most accurately transferring a photolithography pattern at the expense of some ion damage to the underlying material. In some implementations, in a second etching step of the trilayer, the PBCO layer is etched at an "off angle" (i.e., an angle less than 90°) in an effort to ensure complete removal of the top YBCO layer without introducing additional ion damage to the bottom YBCO layer. In some implementations, the off angle ranges between 30° and 70°. In some implementations, the off angle ranges between 40° and 60°. The etching parameters are provided in Table 3 in accordance with various implementations of the invention. These particular etching parameters may be specific to an ion mill being used, and may not be universally applicable to other ion mills or other etching tools as would be appreciated.

TABLE 3

| | | Etching Parameters | | |
| --- | --- | --- | --- | --- |
| Step | Impact Angle | Etch Rate (Å/s) | Time (s) | Etch depth (Å) |
| 1 | 90° | 2 | 312 | 640 |
| 2 | 50° | 2 | 30 | 60 |

Figure 24:
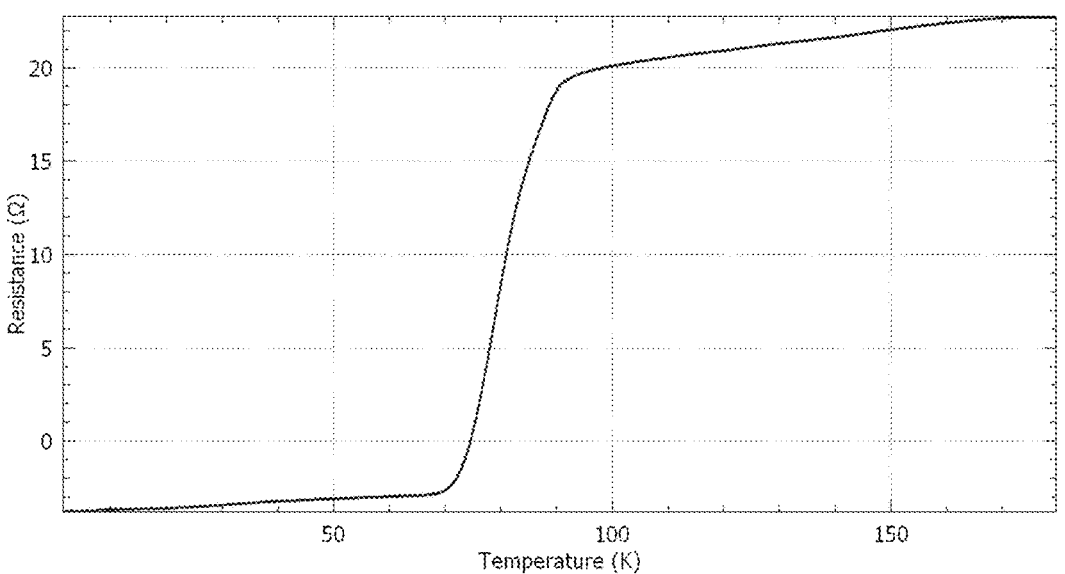
FIG. 24 illustrates an R-T curve for a top layer of YBCO (in a YBCO/PBCO/TBCO trilayer) confirming presence of a critical temperature, $T_c$, and hence, transition of this layer of YBCO to a superconducting state, according to various implementations of the invention.

In this example, a measurement of $T_c$ on the bottom YBCO layer covered with PBCO indicated an open circuit, thereby verifying an intact insulating PBCO layer over the bottom YBCO layer. In addition, AFM was used to accurately measure a total amount of material removed for step 1 and 2 combined as approximately 700 Å; though some ion damage beyond the PBCO layer into the bottom YBCO layer may still be possible. FIG. 24 illustrates an R-T curve for the top YBCO layer (in a YBCO/PBCO/YBCO trilayer) confirming presence of a critical temperature, $T_c$, and hence, transition of this top YBCO layer to a superconducting state. This R-T curve confirms that the etching parameters did not negatively impact this top layer.

However, leaving the bottom YBCO layer covered with PBCO makes a direct electrical contact with the bottom YBCO layer extremely difficult, if not impossible (which is why $T_c$ on the bottom layer measured as an open circuit). To combat this, in some implementations of the invention, the bottom YBCO layer was indirectly contacted via a relatively large secondary Josephson Junction (e.g., 400 μm×400 μm). FIG. 27B illustrates the larger secondary Josephson Junction (illustrated as JJ-2) indirectly contacted to the bottom YBCO layer of the smaller Josephson Junction under test (illustrated as JJ-1). As illustrated, each Josephson Junction under test is coupled in series to the larger Josephson Junction. (For the sake of completeness, prior testing relied on an initial testing configuration illustrated in FIG. 27A which required direct electrical contact with the bottom YBCO layer, which contact is no longer possible in implementations with a covering layer of PBCO.)

Figure 25:
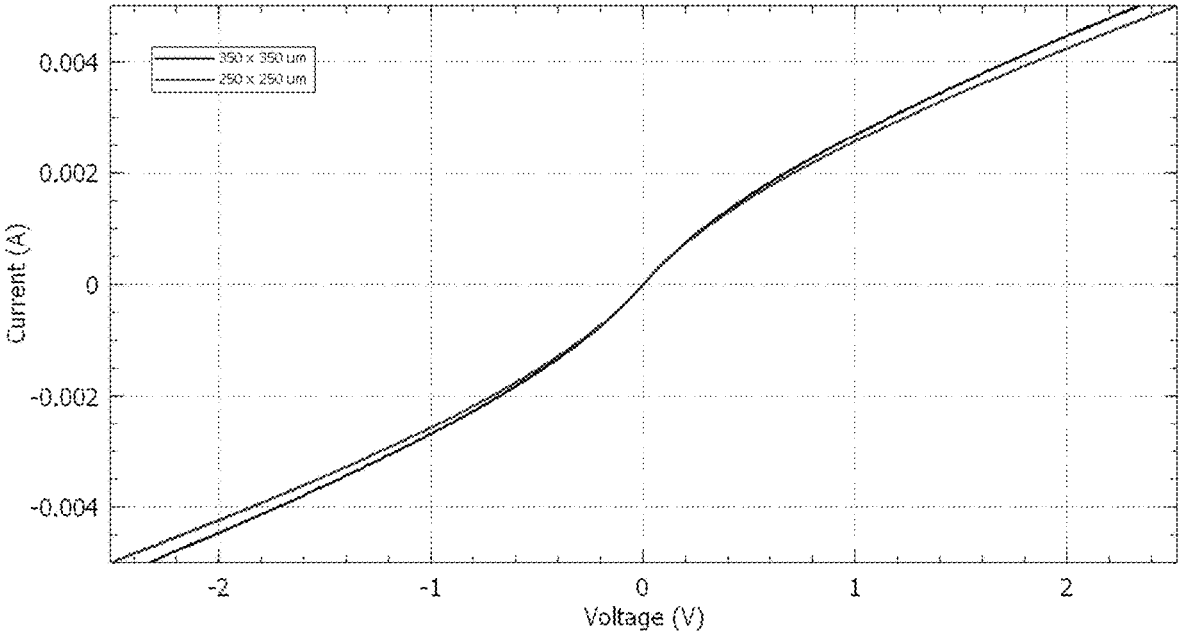
FIG. 25 illustrates an I-V curve confirming operation for each of two Josephson Junctions under test, according to various implementations of the invention.

As would be appreciated, a larger Josephson Junction will have a much larger $I_c$ in comparison to the smaller Josephson Junction, and therefore (ideally) stay in its superconducting state even as the smaller Josephson Junction transitions to its resistive state. (See, e.g., FIG. 26.) In essence, the larger Josephson Junction acts as a superconducting wire connecting to the bottom YBCO layer through the PBCO, allowing measurements of various characteristics of the smaller Josephson Junction under test. In some implementations of the invention, to ensure that the larger Josephson Junction acts as a superconducting wire, a scaling factor may be greater than 3 (i.e., the larger Josephson Junction may be 3 times larger in area, or more, than the smaller Josephson Junction under test). As would be appreciated, this scaling factor may improve the I-V curves of the Josephson Junction under test. In the examples of FIG. 25, the scaling factors were both less than 3. However, the scaling factor may be increased as the size of the smaller Josephson Junction under test are decreased.

FIG. 25 illustrates an I-V curve confirming operation for each of two Josephson Junctions (one 350 µm×350 µm and one 250 µm×250 µm), according to various implementations of the invention. In some implementations of the invention, a size of each of these Josephson Junction may be reduced to roughly 5 µm×5 µm or smaller.

The I-V curves of FIG. 25 illustrate soft transitions from superconducting state to resistive state with a critical current, $I_c$, of ~1 mA, which current is typical of conventional Josephson Junctions. These I-V curves confirm successful contact with both top and bottom YBCO layers in the trilayer, which remained intact during and after fabrication. FIG. 26 illustrates an ideal I-V curve for operation of a Josephson Junction, with a strong transition between a superconducting and resistive states as would be appreciated. While the critical currents of the I-V curves of FIG. 25 are not as sharply defined as the ideal I-V curve in FIG. 26, subsequent fabrication improvements are expected to improve these I-V curves. Such fabrication process improvements may include, but are not limited to, reducing the size of the Josephson Junction under test, increasing the scaling factor, and other fabrication improvements.

In some implementations of the invention, ion mill damage may be used advantageously to pattern damaged regions as electrical insulation, which is a common fabrication step for semiconductor and superconductor circuits used to isolate one part of the circuit from another as would be appreciated.

While the invention has been described herein in terms of various implementations, it is not so limited and is limited only by the scope of the following claims, as would be apparent to one skilled in the art. These and other implementations of the invention will become apparent upon consideration of the description provided above and the accompanying figures. In addition, various components and features described with respect to one implementation of the invention may be used in other implementations as would be appreciated.

What is claimed:

1. A method of etching a trilayer having a top YBCO layer, a PBCO layer, and a bottom YBCO layer, each layer having its own thickness, the method comprising:
    etching a portion of the top YBCO layer of the trilayer via ion milling to substantially remove the thickness of the portion of the top YBCO layer; and
    etching the PBCO layer of the trilayer underlying the etched portion of the top YBCO layer via ion milling to remove any remaining thickness of the etched portion of the top YBCO layer and to remove some but not all of the thickness of the underlying PBCO layer,
    wherein the etching of the PBCO layer is at an ion mill etching angle less than that for the etching of the top YBCO layer.

2. The method of claim 1, wherein etching a portion of the top YBCO layer via ion milling to substantially remove the thickness of the portion of the top YBCO layer comprises etching the thickness of the portion of the top YBCO layer via ion milling at an ion mill etch angle of 90° to substantially remove the thickness of the portion of the top YBCO layer.

3. The method of claim 1, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying portion of the PBCO layer via ion milling without introducing additional ion damage to the bottom YBCO layer of the trilayer.

4. The method of claim 1, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying PBCO layer via ion milling at an ion mill etch angle less than 90°.

5. The method of claim 4, wherein etching the underlying PBCO layer via ion milling at an ion mill etch angle less than 90° comprises etching the underlying PBCO layer via ion milling at an ion mill etch angle between 30° and 70°.

6. The method of claim 4, wherein etching the underlying PBCO layer via ion milling at an ion mill etch angle less than 90° comprises etching the underlying PBCO layer via ion milling at an ion mill etch angle between 40° and 60°.

7. The method of claim 1, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying PBCO layer via ion milling at an off angle.

8. The method of claim 1, wherein the top YBCO layer comprises a-axis YBCO and the bottom YBCO layer comprises a-axis YBCO.

9. A method for fabricating a Josephson Junction out of a trilayer having a top YBCO layer, a PBCO layer, and a bottom YBCO layer, each layer having its own thickness, the method comprising:
    etching a portion of the top YBCO layer of the trilayer via ion milling to substantially remove the thickness of the portion of the top YBCO layer; and
    etching the PBCO layer of the trilayer underlying the etched portion of the top YBCO layer via ion milling to remove any remaining thickness of the etched portion of the top YBCO layer and to remove some but not all of the thickness of the underlying PBCO layer,
    wherein the etching of the PBCO layer is at an ion mill etching angle less than that for the etching of the top YBCO layer.

10. The method of claim 9, wherein etching a portion of the top YBCO layer via ion milling to substantially remove the thickness of the portion of the top YBCO layer comprises etching the thickness of the portion of the top YBCO layer via ion milling at an ion mill etch angle of 90° to substantially remove the thickness of the portion of the top YBCO layer.

11. The method of claim 9, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying portion of the PBCO layer via ion milling without introducing additional ion damage to the bottom YBCO layer of the trilayer.

12. The method of claim 9, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying PBCO layer via ion milling at an off angle.

13. The method of claim 9, wherein etching the PBCO layer of the trilayer underlying the etched portion of the top YBCO layer via ion milling to remove any remaining thickness of the etched portion of the top YBCO layer and to remove some but not all of the thickness of the underlying PBCO layer comprises etching the underlying PBCO layer via ion milling at an ion mill etch angle less than 90°.

14. The method of claim 13, wherein etching the underlying PBCO layer via ion milling at an ion mill etch angle less than 90° comprises etching the underlying PBCO layer via ion milling at an ion mill etch angle between 30° and 70°.

15. The method of claim 13, wherein etching the underlying PBCO layer via ion milling at an ion mill etch angle less than 90° comprises etching the underlying PBCO layer via ion milling at an ion mill etch angle between 40° and 60°.

16. The method of claim 9, wherein the top YBCO layer comprises a-axis YBCO and the bottom YBCO layer comprises a-axis YBCO.

17. A method for fabricating a Josephson Junction out of a trilayer having a top YBCO layer, a PBCO layer, and a bottom YBCO layer, each layer having its own thickness, the method comprising:

etching a portion of the top YBCO layer of the trilayer via ion milling at an ion mill etch angle of 90° to substantially remove the thickness of the portion of the top YBCO layer; and etching the PBCO layer of the trilayer underlying the etched portion of the top YBCO layer via ion milling at an ion mill etch angle of less than 90° to remove any remaining thickness of the etched portion of the top YBCO layer and to remove some but not all of the thickness of the underlying PBCO layer.

18. The method of claim 17, wherein etching the underlying PBCO layer via ion milling at an ion mill etch angle less than 90° comprises etching the underlying PBCO layer via ion milling at an ion mill etch angle between 30° and 70°.

19. The method of claim 17, wherein etching the underlying PBCO layer via ion milling at an ion mill etch angle less than 90° comprises etching the underlying PBCO layer via ion milling at an ion mill etch angle between 40° and 60°.

20. The method of claim 17, wherein the top YBCO layer comprises a-axis YBCO and the bottom YBCO layer comprises a-axis YBCO.

* * * * *